(12) United States Patent
Oike

(10) Patent No.: US 11,948,889 B2
(45) Date of Patent: Apr. 2, 2024

(54) SEMICONDUCTOR MEMORY DEVICE

(71) Applicant: Kioxia Corporation, Tokyo (JP)

(72) Inventor: Go Oike, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 64 days.

(21) Appl. No.: 17/018,838

(22) Filed: Sep. 11, 2020

(65) Prior Publication Data

US 2021/0091003 A1 Mar. 25, 2021

(30) Foreign Application Priority Data

Sep. 19, 2019 (JP) .................................. 2019-170497

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H10B 41/27* (2023.02); *H10B 43/10* (2023.02); *H10B 43/27* (2023.02); *H10B 43/35* (2023.02); *H10B 43/40* (2023.02); *H10B 43/50* (2023.02)

(58) Field of Classification Search
CPC ........................ H01L 27/1157; H01L 27/11575
See application file for complete search history.

(56) References Cited

U.S. PATENT DOCUMENTS 10,170,248 B2   1/2019   Kwong
10,199,511 B1   2/2019   Nakaki
(Continued)

FOREIGN PATENT DOCUMENTS

CN   110021608 A   7/2019
JP   2019-121717 A   7/2019

*Primary Examiner* — Farun Lu
(74) *Attorney, Agent, or Firm* — Oblon, McClelland, Maier & Neustadt, L.L.P.

(57) ABSTRACT

According to one embodiment, a semiconductor memory device includes a stacked body, a pillar, a strip part, a plurality of first contacts, and a second contact. The stacked body includes a plurality of conductive layers stacked via an insulating layer, and includes, at each of opposite ends in a first direction, a first staircase part in which the conductive layers are terminated stepwise. The pillar extends in the stacked body in a stacking direction of the stacked body, and form memory cells at positions intersecting with at least some conductive layers of the plurality of conductive layers. The strip part divides the stacked body in the first direction by extending in a second direction crossing the first direction. The plurality of first contacts are arranged in the first staircase part, in which each of the first contacts is connected to one of the conductive layers at each step of the first staircase part. The second contact is arranged on the strip part side of the stacked body and is connected to an uppermost conductive layer of the plurality of conductive layers, the some conductive layers are connected to the memory cells and arranged in contact with the strip part, of the plurality of conductive layers.

16 Claims, 14 Drawing Sheets

(51) Int. Cl.
*H01L 23/522* (2006.01)
*H01L 23/528* (2006.01)
*H10B 41/27* (2023.01)
*H10B 43/10* (2023.01)
*H10B 43/27* (2023.01)
*H10B 43/35* (2023.01)
*H10B 43/40* (2023.01)
*H10B 43/50* (2023.01)

(56) References Cited

U.S. PATENT DOCUMENTS

| | | |
|---|---|---|
| 10,242,993 B2 | 3/2019 | Ichinose |
| 10,290,595 B2* | 5/2019 | Oshiki .............. H01L 23/53257 |
| 10,355,012 B2 | 7/2019 | Shimabukuro et al. |
| 10,896,915 B2 | 1/2021 | Oike et al. |
| 11,557,605 B2 | 1/2023 | Oike et al. |
| 2017/0263634 A1* | 9/2017 | Inokuma ........... H01L 27/11565 |
| 2017/0358594 A1 | 12/2017 | Lu et al. |
| 2018/0076085 A1* | 3/2018 | Hazue .................... H10B 43/10 |
| 2018/0268902 A1 | 9/2018 | Tanaka |
| 2019/0027434 A1 | 1/2019 | Jung et al. |
| 2019/0214403 A1 | 7/2019 | Oike et al. |
| 2019/0287995 A1* | 9/2019 | Oike ....................... G11C 16/08 |
| 2020/0303402 A1* | 9/2020 | Kobayashi ........ H01L 27/11556 |
| 2021/0098492 A1 | 4/2021 | Oike et al. |
| 2023/0113904 A1 | 4/2023 | Oike et al. |

* cited by examiner

SEMICONDUCTOR MEMORY DEVICE

CROSS-REFERENCE TO RELATED APPLICATIONS

This application is based upon and claims the benefit of priority from Japanese Patent Application No. 2019-170497, filed on Sep. 19, 2019; the entire contents of which are incorporated herein by reference.

FIELD

Embodiments of the present invention described herein relate generally to a semiconductor memory device.

BACKGROUND

In a three-dimensional nonvolatile memory, memory cells are arranged in a three-dimensional manner within a stacked body in which, for example, a plurality of conductive layers are stacked. At each of the opposite ends of the stacked body, a staircase part is provided by the conductive layers arranged stepwise, at which electric signals can be input and output to and from the conductive layers.

In order to improve the signal transmission speed for the conductive layers, a configuration is known that divides the stacked body into two sections, for example. In each of the two sections of the stacked body thus divided, memory cells are operated by input signals from the staircase part on the corresponding one side. However, it is difficult to confirm how an input signal from the staircase part is transmitted to near the dividing part that is most distant from the staircase part.

DETAILED DESCRIPTION

In general, according to one embodiment, a semiconductor memory device includes a stacked body, a pillar, a strip part, a plurality of first contacts, and a second contact. The stacked body includes a plurality of conductive layers stacked via an insulating layer, and includes, at each of opposite ends in a first direction, a first staircase part in which the conductive layers are terminated stepwise. The pillar extends in the stacked body in a stacking direction of the stacked body, and form memory cells at positions intersecting with at least some conductive layers of the plurality of conductive layers. The strip part divides the stacked body in the first direction by extending in a second direction crossing the first direction. The plurality of first contacts are arranged in the first staircase part, in which each of the first contacts is connected to one of the conductive layers at each step of the first staircase part. The second contact is arranged on the strip part side of the stacked body and is connected to an uppermost conductive layer of the plurality of conductive layers, the some conductive layers are connected to the memory cells and arranged in contact with the strip part, of the plurality of conductive layers.

Hereinafter, the present invention will be explained below in detail with reference to the accompanying drawings. The present invention is not limited to the following embodiments. The constituent elements in the following embodiments encompass those which can be easily assumed by a person skilled in the art, or which are substantially equivalent thereto.

In this specification, the upward and downward directions of a semiconductor memory device in the embodiments are defined on the basis of the shape of a staircase part described later. Specifically, the facing direction of each terrace portion of the staircase part, i.e., of the exposed surface of an insulating layer at each step of the staircase part, is defined as the upward direction of the semiconductor memory device.

Embodiment 1

A detailed explanation will be given of an embodiment 1 with reference to some of the accompanying drawings.

(Configuration Example of Semiconductor Memory Device)

Figure 1:
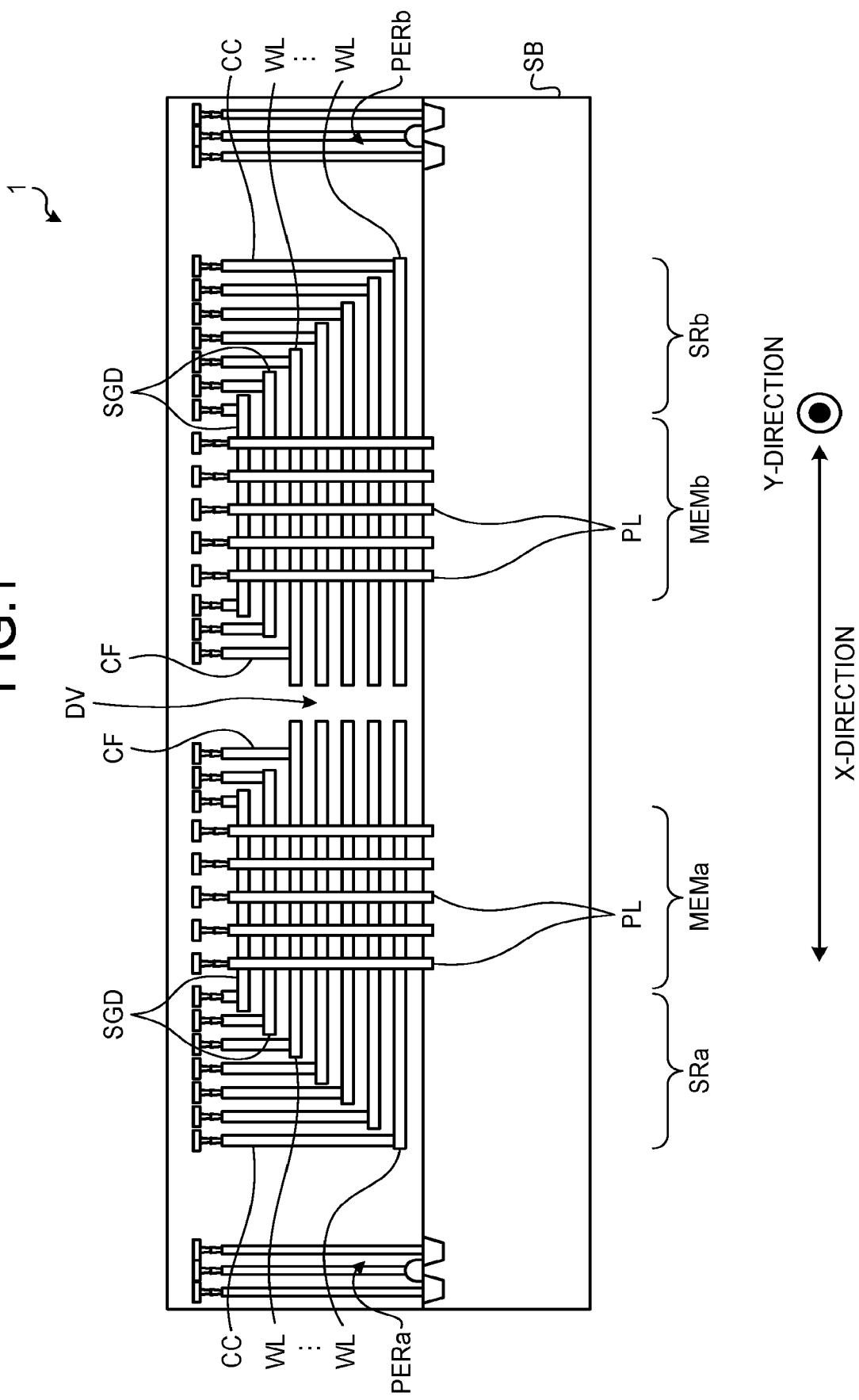
FIG. 1 is a sectional view of a semiconductor memory device according to an embodiment 1.

FIG. 1 is a sectional view of a semiconductor memory device 1 according to the embodiment 1. As illustrated in FIG. 1, the semiconductor memory device 1 includes a substrate SB, memory parts MEMa and MEMb, and peripheral circuits PERa and PERb.

For example, the substrate SB is a semiconductor substrate, such as a silicon substrate. A plurality of word lines WL are stacked above the substrate SB, and a plurality of selection gate lines SGD are stacked above the word lines WL, such that the two memory parts MEMa and MEMb are thereby configured, for example.

Some of the plurality of word lines WL constituting the memory part MEMa include a staircase part SRa at one end in an X-direction (on the left side in FIG. 1). In the staircase part SRa, the word lines WL are terminated stepwise. At the other end, the plurality of word lines WL are terminated as a substantially vertical standing array. Some of the plurality of selection gate lines SGD above the word lines WL constitute, at the one end, part of the staircase part SRa including the uppermost step. Some of the plurality of selection gate lines SGD are terminated stepwise also at the other end.

Some others of the plurality of word lines WL constituting the memory part MEMb has a configuration obtained by inverting the configuration of the some of the word lines WL described above. Specifically, these others of the word lines WL include a staircase part SRb at one end in the X-direction (on the right side in FIG. 1). In the staircase part SRb, the word lines WL are terminated stepwise. At the other end, these word lines WL are terminated as a substantially vertical standing array. Further, some others of the plurality of selection gate lines SGD above the others of the word lines WL constitute, at the one end, part of the staircase part SRb including the uppermost step, and are terminated stepwise at the other end.

The memory parts MEMa and MEMb are adjacent to each other at the respective ends where the word lines WL are arrayed in a standing state. Such a configuration of the memory parts MEMa and MEMb can be obtained by, for example, dividing word lines WL including the staircase parts SRa and SRb at the opposite ends, by a dividing part DV near the center.

Each of the memory parts MEMa and MEMb is provided with a plurality of pillars PL that penetrate the selection gate lines SGD and the word lines WL in the stacking direction. A plurality of memory cells are formed at the intersecting portions of the pillars PL with the word lines WL. In this way, the memory cells are arranged in a three-dimensional manner in the memory parts MEMa and MEMb.

In each of the staircase parts SRa and SRb where the word lines WL and the selection gate lines SGD are arranged stepwise together, contacts CC are provided that connect the word lines WL and the selection gate lines SGD to upper layer wiring lines or the like. Consequently, it is possible to individually lead out the word lines WL and the selection gate lines SGD that are stacked in multiple layers, and to perform input and output of electric signals to and from the word lines WL and the selection gate lines SGD.

At each of the other ends where the word lines WL are arrayed in a standing state, a contact CF is provided on the uppermost word line WL, for example. Also at each of the other ends, contacts CF are connected to respective selection gate lines SGD arranged stepwise, for example. These contacts CF can be exclusively used to monitor electric signals with respect to the word lines WL and the selection gate lines SGD.

On the outer sides of the staircase parts SRa and SRb in the X-direction, the peripheral circuits PERa and PERb are arranged, each of which includes transistors TR on the surface of the substrate SB and various wiring lines or the like connected to the transistors TR. The peripheral circuit PERa as a first circuit contributes to operations of the memory cells belonging to the memory part MEMa, for example. The peripheral circuit PERb as a second circuit contributes to operations of the memory cells belonging to the memory part MEMb, for example.

Next, with reference to FIGS. 2A to 2C and 3, an explanation will be given of a detailed configuration example of the semiconductor memory device 1.

Figure 2A:
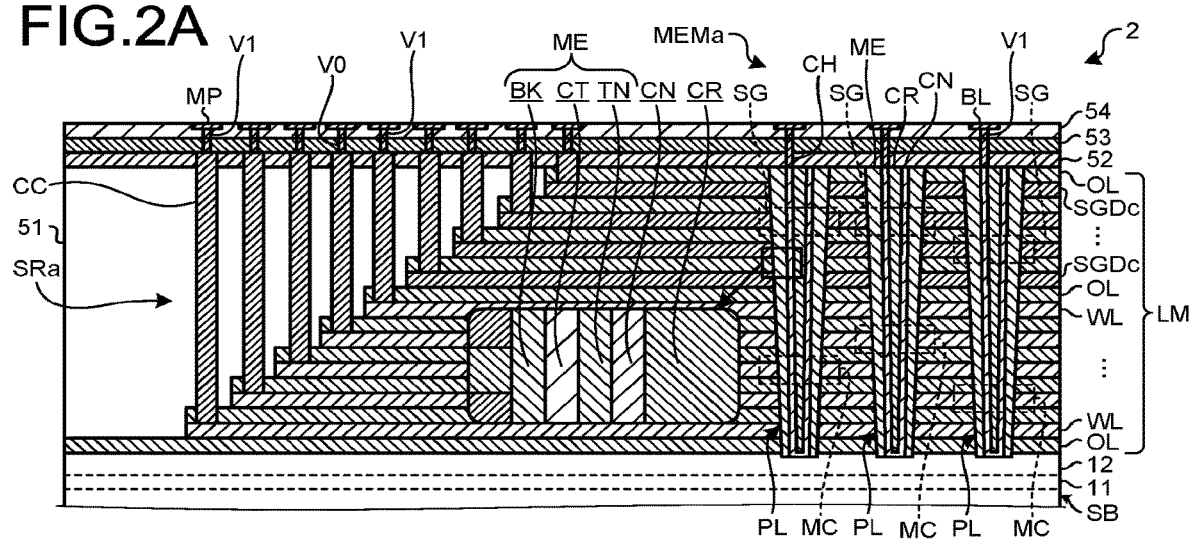
FIGS. 2A to 2C are sectional views of the semiconductor memory device according to the embodiment 1.
Figure 2B:
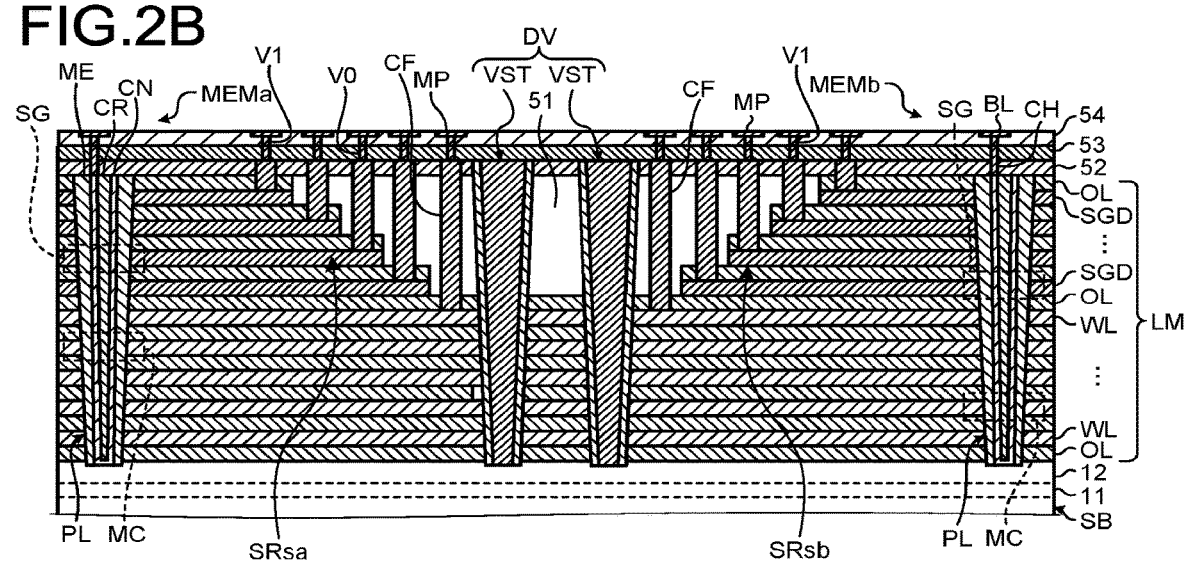
Figure 2C:
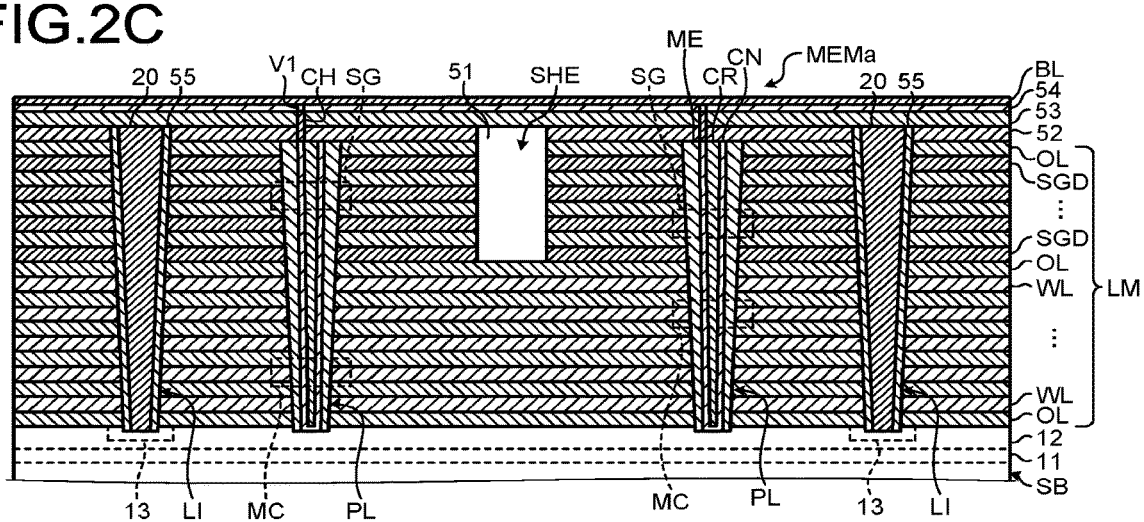

FIGS. 2A to 2C are sectional views of the semiconductor memory device 1 according to the embodiment 1. FIG. 2A is an X-direction sectional view of the memory part MEMa and the staircase part SRa of the semiconductor memory device 1. FIG. 2B is an X-direction sectional view near the dividing part DV of the semiconductor memory device 1. FIG. 2C is a Y-direction sectional view of the memory part MEMa of the semiconductor memory device 1. It should be noted that the memory part MEMb and the staircase part SRb have configurations substantially the same as those of the memory part MEMa and the staircase part SRa except for inversion in structure from the memory part MEMa and the staircase part SRa.

Figure 3:
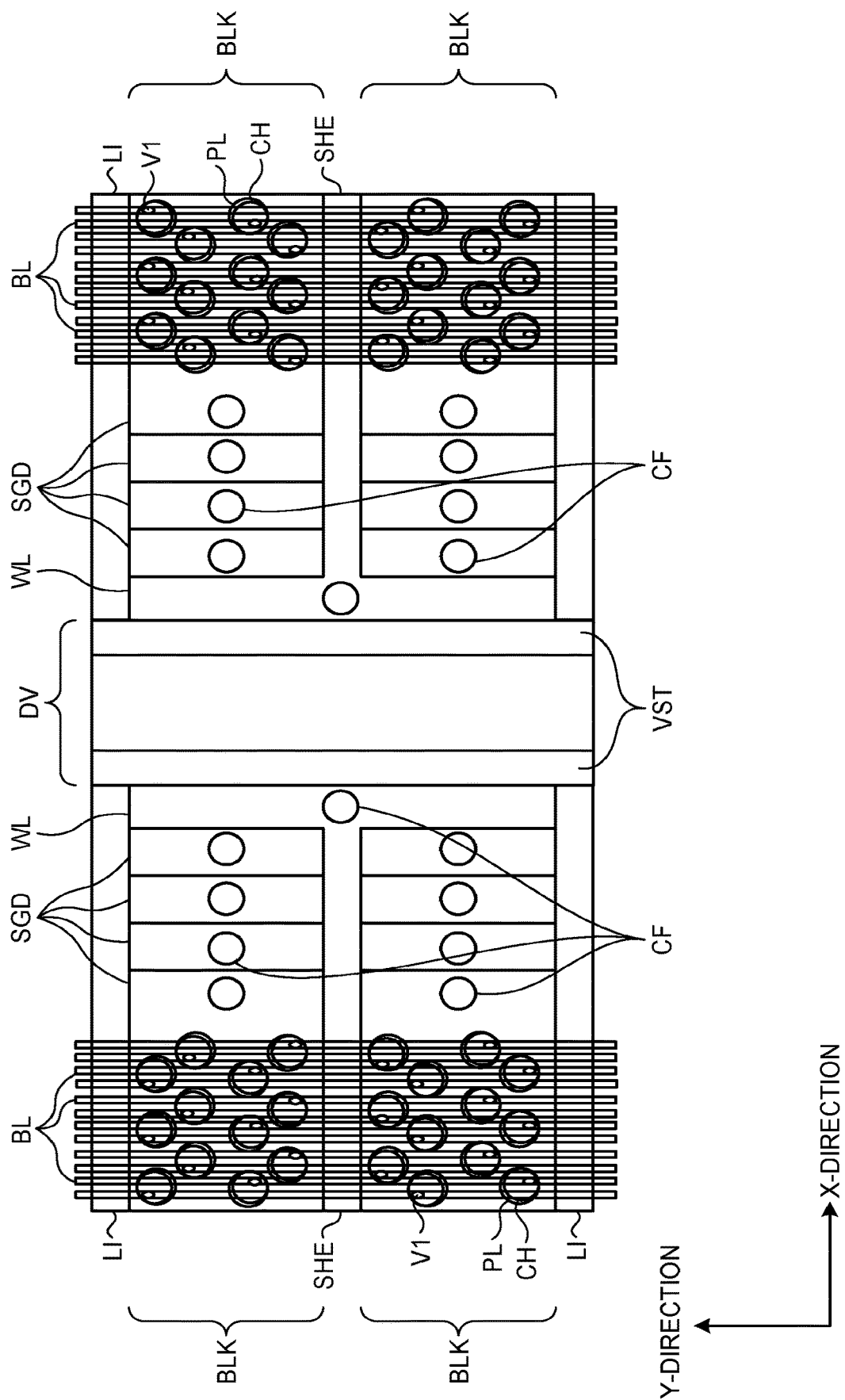
FIG. 3 is a plan view near a dividing part of the semiconductor memory device according to the embodiment 1.

FIG. 3 is a plan view near the dividing part DV of the semiconductor memory device 1 according to the embodiment 1. Here, in FIG. 3, insulating layers 51 to 53, plugs CH and V0, and so forth are omitted. Further, the number and arrangement of individual components in FIG. 3 are mere examples, and can be changed optionally.

As illustrated in FIGS. 2A to 2C, the substrate SB of the semiconductor memory device 1 includes an n-well 11 in the surface, a p-well 12 in the n-well 11, and a plurality of $n^+$-diffusion regions 13 in the p-well 12. Each of the n'-diffusion regions 13 is arranged in contact with a contact LI described later.

A stacked body LM is arranged on the substrate SB. The stacked body LM has a configuration as a lower structure in which word lines WL as conductive layers and insulating layers OL are alternately stacked one by one into a plurality of layers. The stacked body LM has a configuration as an upper structure in which selection gate lines SGD as conductive layers and insulating layers OL are alternately stacked one by one into a plurality of layers. For example, each of the word lines WL and the selection gate lines SGD includes tungsten, molybdenum, or the like. For example, each of the insulating layers OL includes $SiO_2$ or the like.

Here, in the example of FIGS. 2A to 2C, the stacked body LM includes five layers of the word lines WL and four layers of the selection gate lines SGD. However, the number of layers of the word lines WL and the selection gate lines SGD is optional. Further, the selection gate lines SGD are selection gate lines on the drain side. The stacked body LM may be configured such that selection gate lines (not illustrated) on the source side are arranged below the lowermost word line WL.

As illustrated in FIG. 2A, the staircase part SRa has a configuration in which the word lines WL and the insulating layers OL are terminated stepwise. The steps of the staircase part SRa, each of which includes one word line WL and one insulating layer OL present as its upper layer, gradually ascend toward the memory part MEMa side. The staircase part SRa is covered with an insulating layer 51. The insulating layer 51 is covered with an insulating layer 52, the insulating layer 52 is covered with an insulating layer 53, and the insulating layer 53 is covered with an insulating layer 54. It should be noted that, in FIGS. 2A to 2C and subsequent figures, the hatching of the insulating layer 51 is omitted to ensure the visibility of contacts CC and so forth described later.

Each step of the staircase part SRa is provided with a contact CC as a first contact. The contact CC penetrates the insulating layers 52 and 51, and the insulating layer OL constituting each step of the staircase part SRa, and reaches the corresponding word line WL. The upper end of the contact CC is connected to an upper layer wiring line, such as a wiring line MP in the insulating layer 54, through a plug V0 penetrating the insulating layer 53 and a plug V1 arranged in the insulating layer 54.

In the memory part MEMa, a plurality of pillars PL are arranged in a matrix format, and penetrate the stacked body LM to reach the p-well 12 of the substrate SB. In each pillar PL, a memory layer ME, a channel layer CN, and a core layer CR are stacked in this order from the inner wall side of the pillar PL. The channel layer CN is present also at the bottom of the pillar PL. The memory layer ME includes a block insulating layer BK, a charge storage layer CT, and a tunnel insulating layer TN in this order from the inner wall side of the pillar PL.

For example, each of the block insulating layer BK, the tunnel insulating layer TN, and the core layer CR includes $SiO_2$ or the like. For example, the charge storage layer CT includes SiN or the like. For example, the channel layer CN includes amorphous silicon, poly silicon, or the like.

The stacked body LM of the memory part MEMa is covered with the insulating layer 52, as in the staircase part SRa. The insulating layer 52 is covered with the insulating layer 53. The channel layer CN of each pillar PL is connected to a plug CH extending through the insulating layers 52 and 53. The upper end of the plug CH is connected to a bit line BL in the insulating layer 54 through a plug V1 arranged in the insulating layer 54.

With the configuration described above, memory cells MC are formed on each pillar PL, at the height positions of the respective word lines WL. In this way, the semiconductor memory device 1 is configured as a three-dimensional nonvolatile memory, in which memory cells MC are arranged in a three-dimensional manner, for example.

When an electric signal is input from the peripheral circuit PERa (see FIG. 1) to a predetermined word line WL, a voltage corresponding thereto is applied from the word line WL to memory cells MC. As the voltage is applied to a certain memory cell MC, a charge is stored in the charge storage layer CT to write data. When a voltage is applied from the peripheral circuit PERa to a predetermined word line WL, data is read from a certain memory cell MC to a bit line BL.

Further, with the configuration described above, selection gates SG are formed on each pillar PL, at the height positions of the respective selection gate lines SGD. When a voltage is applied from the peripheral circuit PERa to a selection gate line SGD, the corresponding selection gate SG is turned on or off, so that the pillars PL associated with the selection gate SG is set in a selected state or non-selected state.

As illustrated in FIGS. 2B and 3, in the dividing part DV that divides the stacked body LM, vertical slits VST extend in the Y-direction as a plurality of strip parts parallelized in the X-direction. Each vertical slit VST penetrates the plurality of word lines WL, and the plurality of insulating layers OL, and reaches the substrate SB.

Consequently, the stacked body LM is divided in the X-direction into a region as a first stacked body section including the memory part MEMa and a region as a second stacked body section including the memory part MEMb. Further, consequently, the end of the stacked body LM in contact with each vertical slit VST, i.e., an end array of the word lines WL constituting the stacked body LM, is in a substantially vertical standing state.

On the other hand, the selection gate lines SGD as upper layers above the word lines WL include staircase parts SRsa and SRsb at the ends on the dividing part DV side. In each of the staircase parts SRsa and SRsb, the selection gate lines SGD are arranged stepwise and out of contact with any vertical slit VST. Each step of the staircase parts SRsa and SRsb is composed of one selection gate line SGD and one insulating layer OL present as its upper layer. The staircase part SRsa gradually ascends toward the memory part MEMa, and the staircase part SRsb gradually ascends toward the memory part MEMb. Thus, the uppermost word line WL of the word lines WL constituting the stacked body LM is present at the position of the lowermost layer in the staircase parts SRsa and SRsb.

Each vertical slit VST is filled with a conductive layer 20 through an insulating layer 55 used as a liner. The portion between the two vertical slits VST and the staircase parts SRsa and SRsb are covered with the insulating layer 51. The insulating layer 51 is covered with the insulating layer 52, the insulating layer 52 is covered with the insulating layer 53, and the insulating layer 53 is covered with the insulating layer 54.

The uppermost word line WL of the word lines WL constituting the stacked body LM is connected to the contact CF as a second contact. The contact CF penetrates the insulating layers 52 and 51, and the insulating layer OL immediately above the uppermost word line WL, and reaches the uppermost word line WL. The upper end of the contact CF is connected to an upper layer wiring line or the like (not illustrated) through a plug V0 penetrating the insulating layer 53.

Such contacts CF may be arranged on at least some of the steps of the staircase parts SRsa and SRsb. In this case, each contact CF as a third contact penetrates the insulating layers 52 and 51, and the insulating layer OL constituting each step of the staircase part SRsa or staircase part SRsb, and reaches the selection gate line SGD present as its lower layer.

Each contact CF can be used to monitor, on the upper layer wiring line side, an electric signal, i.e., a voltage, input from a contact CC of the staircase parts SRa or SRb on the one side and transmitted through the word line WL or selection gate line SGD.

As illustrated in FIGS. 2C and 3, the stacked body LM is provided with a plurality of contacts LI extending in the X-direction. The plurality of contacts LI are arrayed in parallel with each other in the Y-direction. Each contact LI penetrates the stacked body LM, and reaches one of the $n^+$-diffusion regions 13 of the substrate SB. Each contact LI is filled with a conductive layer 20 through an insulating layer 55 used as a liner, and each contact LI functions as a source line contact, for example.

The pillars PL described above are arranged between these contacts LI. The pillars PL arranged between the two contacts LI define one block BLK, for example. A plurality of pillars PL share one bit line BL, within one block BLK and over a plurality of blocks BLK.

Therefore, a shallow groove SHE is provided between the two contacts LI and extends in the X-direction to split the selection gate lines SGD within the block BLK in the Y-direction. The shallow groove SHE penetrates the selection gate lines SGD of the stacked body LM and the insulating layers OL paired therewith, and reaches the insulating layer OL immediately above the uppermost word line WL. The shallow groove SHE is filled with an insulating layer 51. In FIGS. 2A to 2C and subsequent figures, the hatching of the insulating layer 51 in the shallow groove SHE is also omitted.

The shallow groove SHE is not connected to any of the vertical slits VST, but as described above, the selection gate lines SGD on each vertical slit VST side is stepwise, so that the selection gate lines SGD can be separated.

(Manufacturing Method of Semiconductor Memory Device)

Next, with reference to FIGS. 4A to 12C, an explanation will be given of a manufacturing method of the semiconductor memory device 1 in the embodiment 1.

FIGS. 4A to 12C are flow-related diagrams illustrating procedures in a manufacturing method of the semiconductor memory device 1 according to the embodiment 1. The figures with drawing numbers including "A" to "C" after the same numeral indicate different sites in the same process step. In FIGS. 4A to 12C, "A" corresponds to the site of FIG. 2A, "B" corresponds to the site of FIG. 2B, and "C" corresponds to the site of FIG. 2C. Here, the memory part MEMb and the staircase part SRb are manufactured by a manufacturing method substantially the same as that of the memory part MEMa and the staircase part SRa except for inversion in structure from the memory part MEMa and the staircase part SRa.

First, on a substrate SB provided with an n-well 11, a p-well 12, and so forth, a peripheral circuit PERa including transistors TR (not illustrated), and so forth, are formed. The peripheral circuit PERa can be formed by using a general method of forming a semiconductor circuit.

Figure 4A:
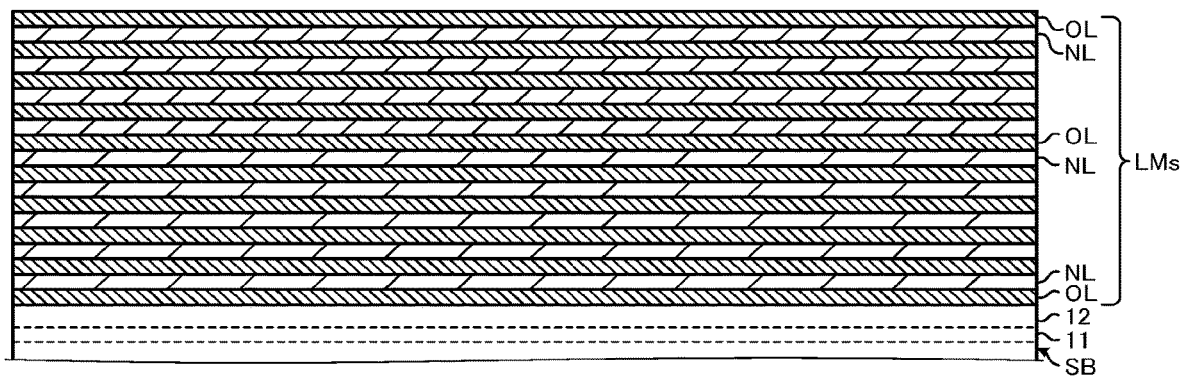
FIGS. 4A to 4C are flow-related diagrams illustrating procedures in a manufacturing method of the semiconductor memory device according to the embodiment 1.
Figure 4B:
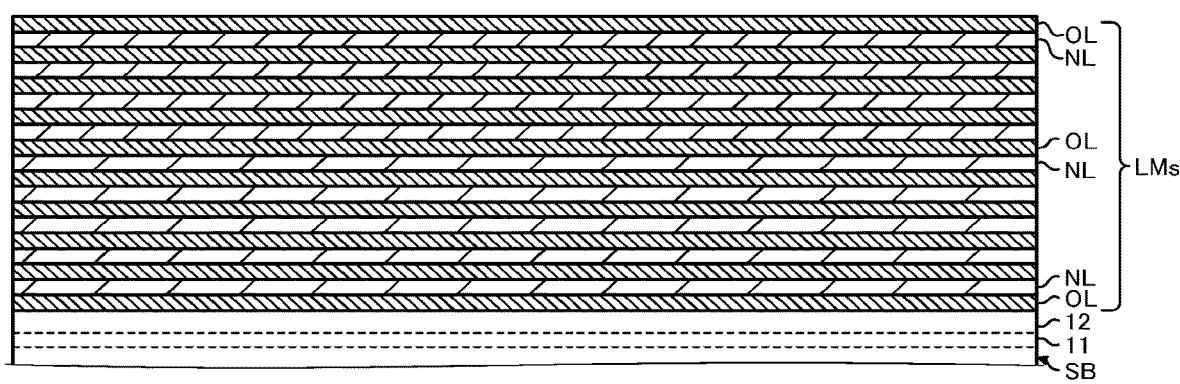
Figure 4C:
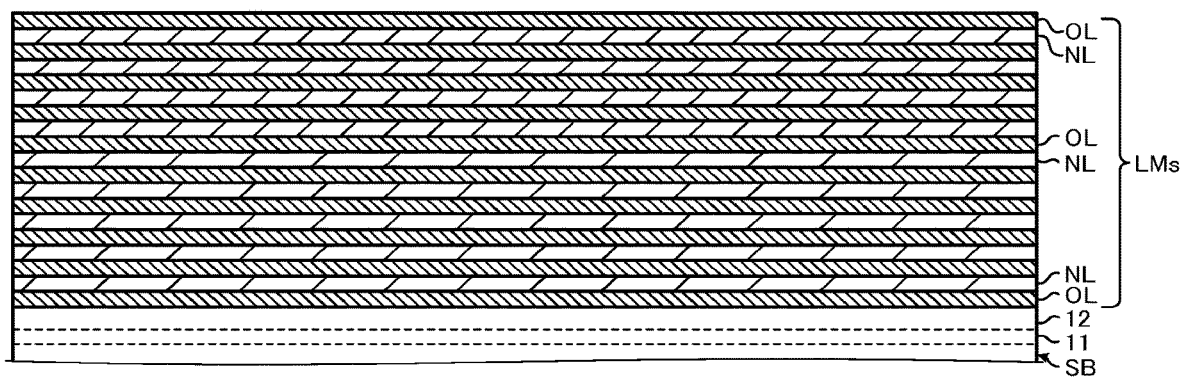

Then, as illustrated in FIGS. 4A to 4C, on the substrate SB, a stacked body LMs is formed such that sacrificial layers NL and insulating layers OL are alternately stacked one by one into a plurality of layers. For example, the sacrificial layers NL include SiN or the like, and are used as layers to be replaced with a conductive material later to form word lines WL and selection gate lines SGD.

Figure 5A:
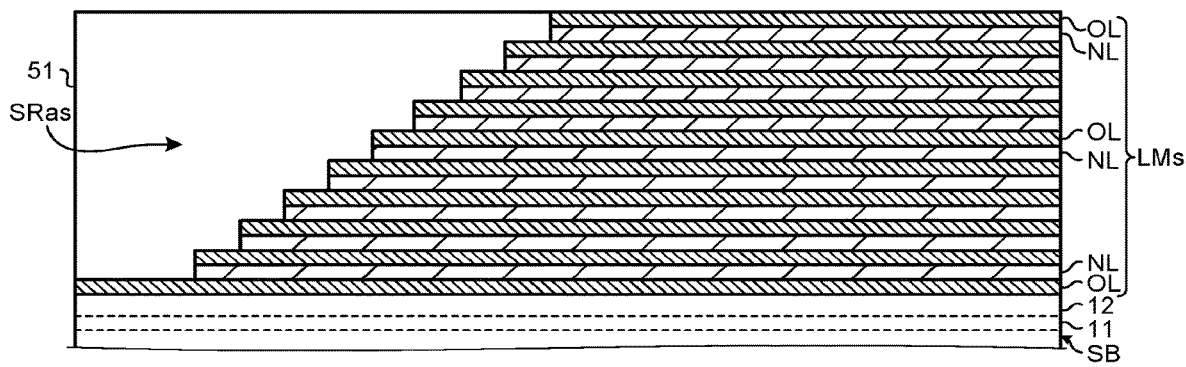
FIGS. 5A to 5C are flow-related diagrams illustrating procedures in the manufacturing method of the semiconductor memory device according to the embodiment 1.

As illustrated in FIG. 5A, a staircase part SRas is formed at the position to be an end of the stacked body LMs.

Figure 5B:
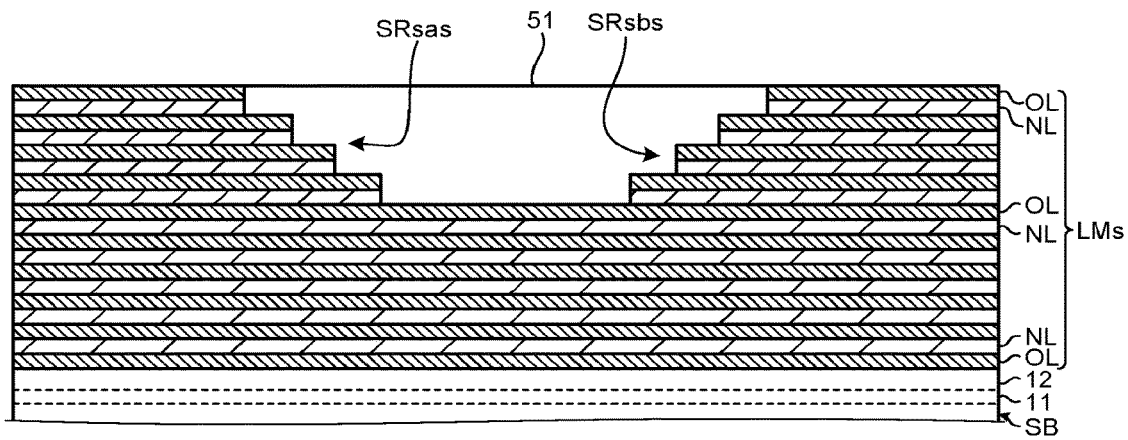
Figure 5C:
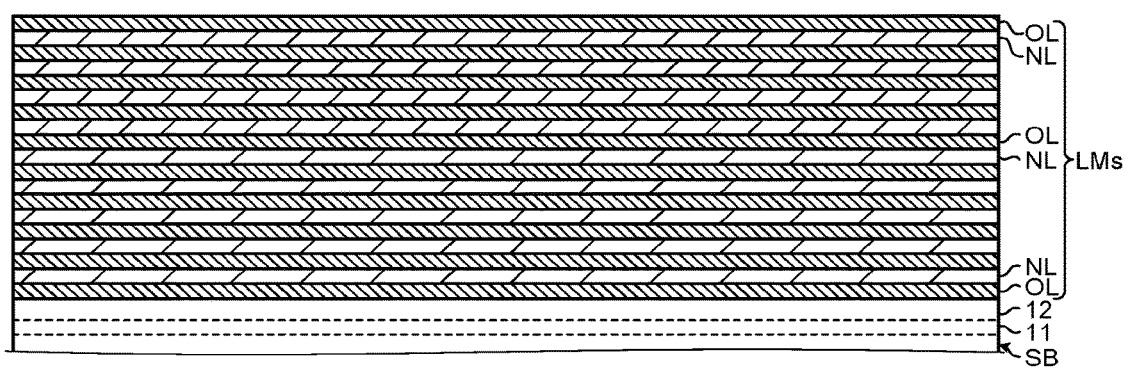

As illustrated in FIG. 5B, staircase parts SRsas and SRsbs are formed near the position to be a dividing part DV of the stacked body LMs.

These staircase parts SRas, SRsas, and SRsbs are formed by partly removing pairs of an insulating layer OL and a sacrificial layer NL one by one, while sliming mask patterns of resist patterns or the like formed on the stacked body LMs, by using $O_2$ plasma or the like.

Thereafter, part of an insulating layer 51 is formed to cover the staircase parts SRas, SRsas, and SRsbs.

Figure 6A:
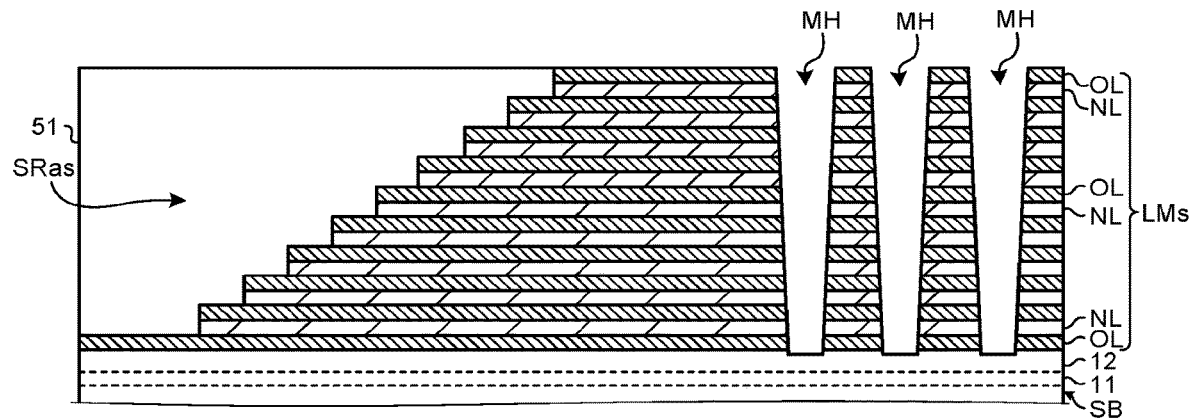
FIGS. 6A to 6C are flow-related diagrams illustrating procedures in the manufacturing method of the semiconductor memory device according to the embodiment 1.
Figure 6B:
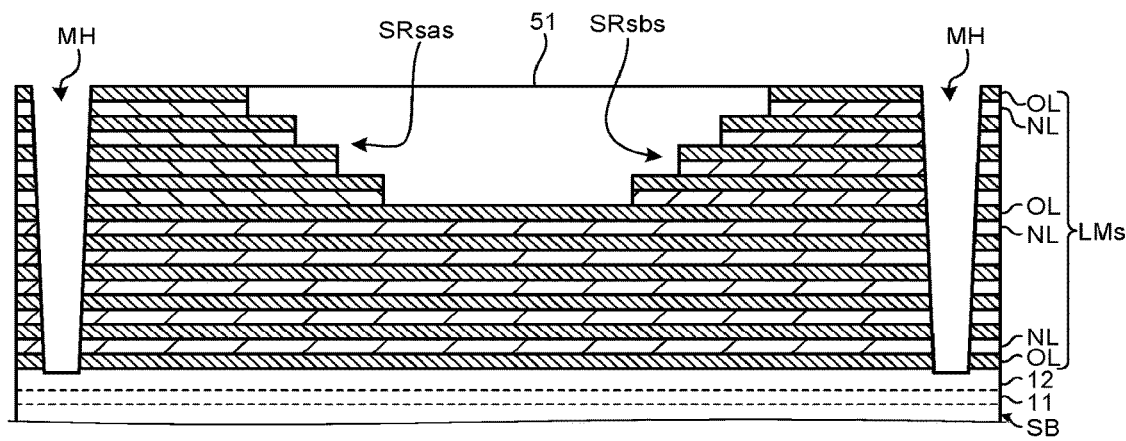
Figure 6C:
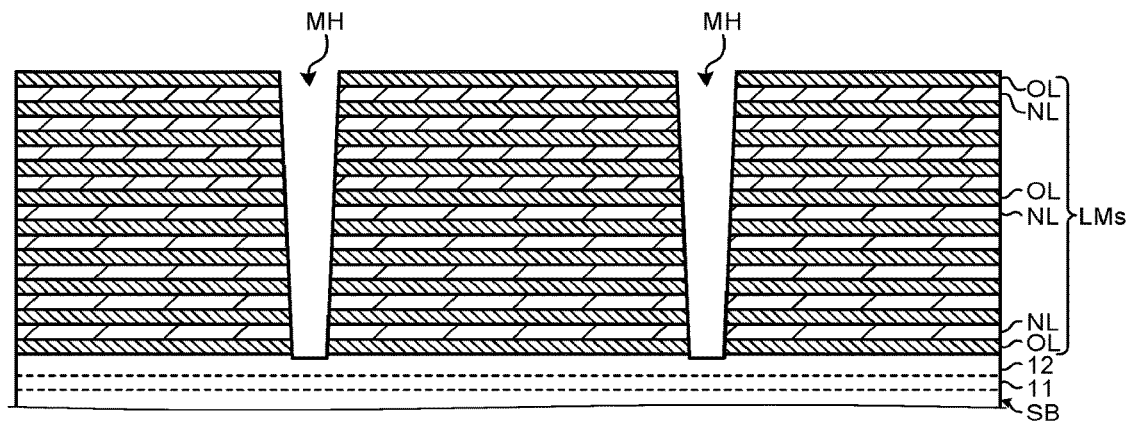

As illustrated in FIGS. 6A to 6C, memory holes MH are formed to penetrate the stacked body LMs and reach the p-well 12 of the substrate SB.

Figure 7A:
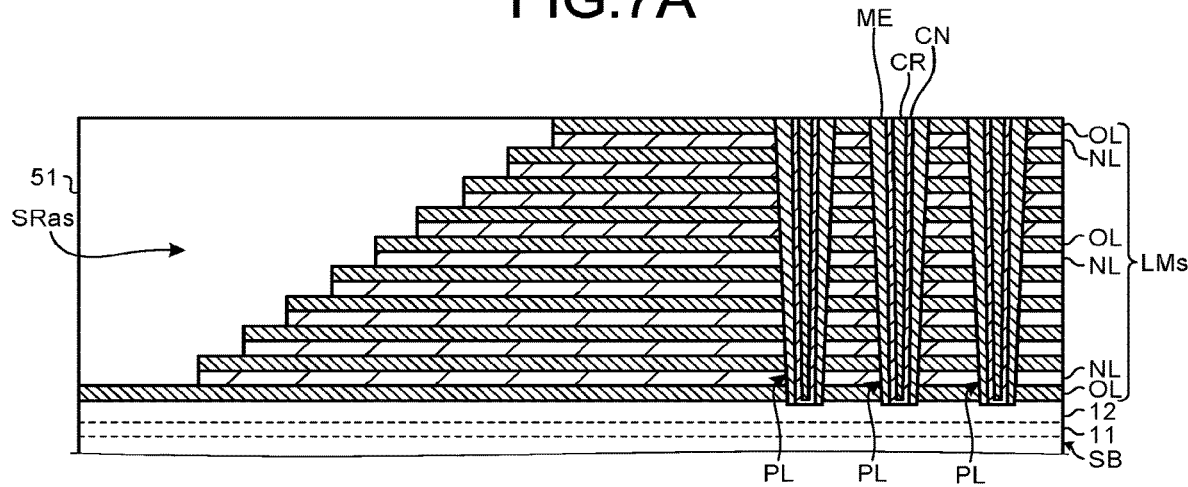
FIGS. 7A to 7C are flow-related diagrams illustrating procedures in the manufacturing method of the semiconductor memory device according to the embodiment 1.
Figure 7B:
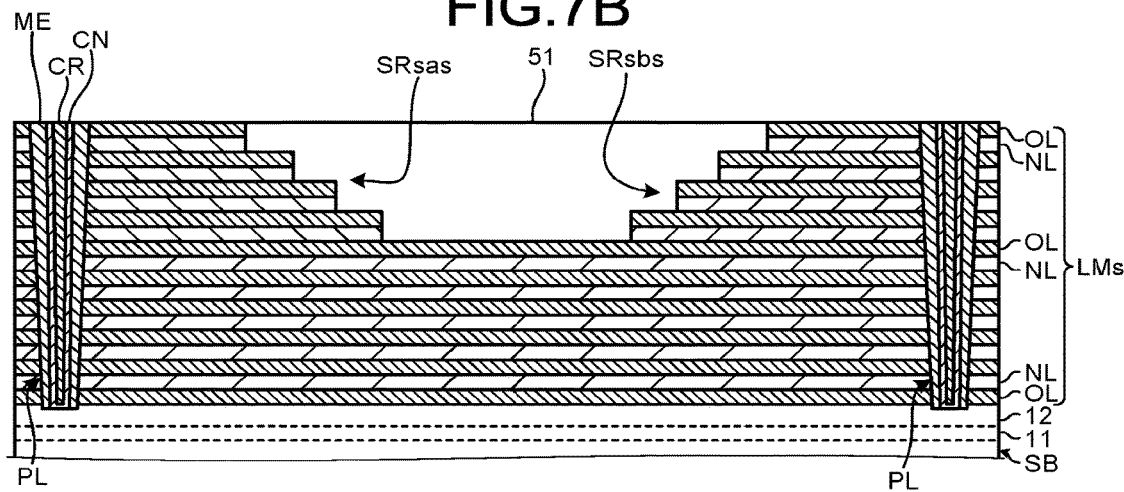
Figure 7C:
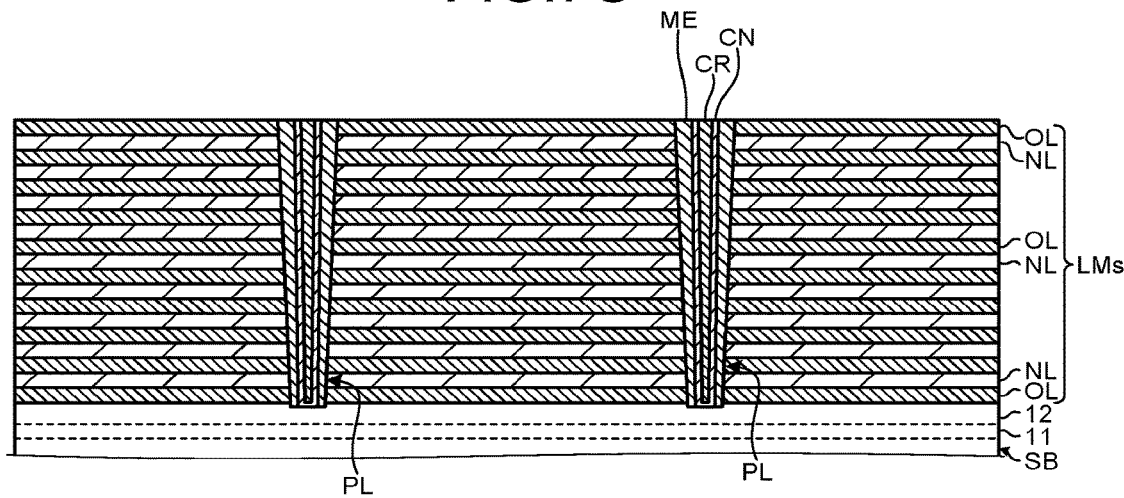

As illustrated in FIGS. 7A to 7C, in each memory hole MH, a memory layer ME is formed on the inner wall side of the memory hole MH. The bottom of each memory layer ME is removed by etching to expose the bottom of the memory hole MH. On the bottom of each memory hole MH thus exposed, silicon is formed by epitaxial growth. Further, a channel layer CN and a core layer CR are formed on the silicon formed by epitaxial growth.

Figure 8A:
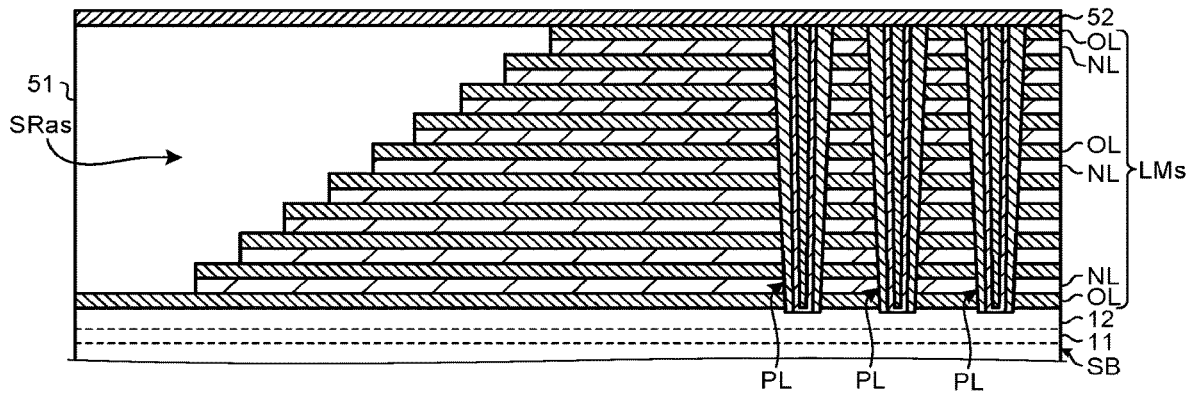
FIGS. 8A to 8C are flow-related diagrams illustrating procedures in the manufacturing method of the semiconductor memory device according to the embodiment 1.
Figure 8B:
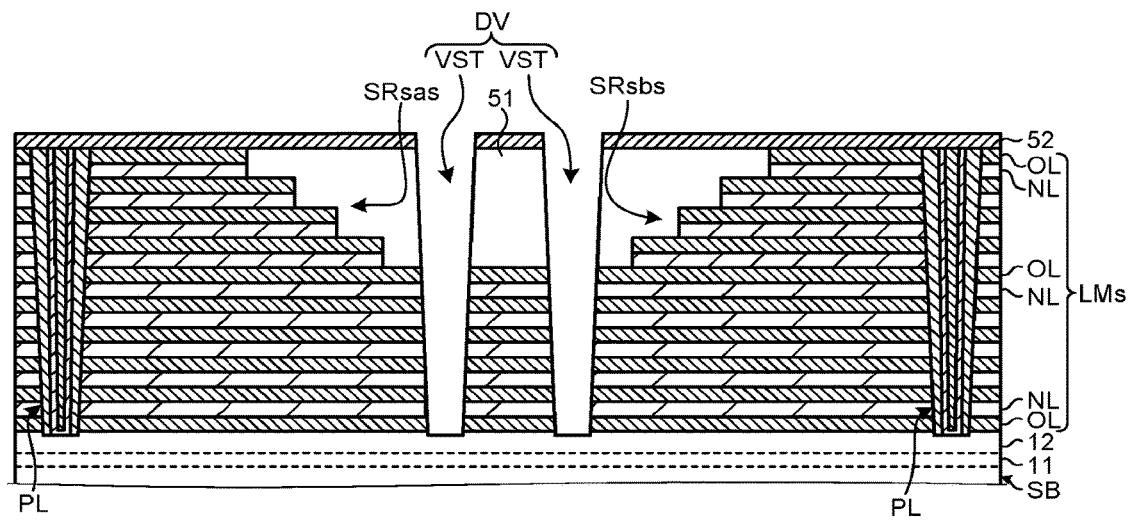
Figure 8C:
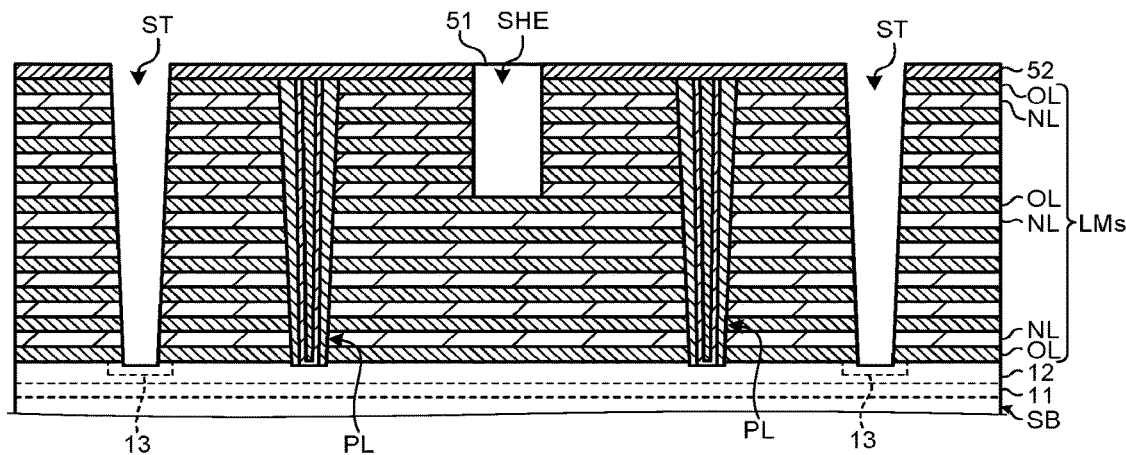

As illustrated in FIGS. 8A to 8C, an insulating layer 52 is formed to cover the stacked body LMs and the insulating layer 51.

As illustrated in FIG. 8C, a shallow groove SHE is formed to penetrate the insulating layer 52 and penetrate the stacked body LMs halfway through. Further, other part of the insulating layer 51 is formed to fill the shallow groove SHE (the hatching of the insulating layer 51 is omitted).

As illustrated in FIG. 8B, in the region to be the dividing part DV, a plurality of vertical slits VST are formed to penetrate the insulating layers 52 and 51 and the stacked body LMs and reach the lowermost insulating layer OL of the stacked body LMs. Further, as illustrated in FIG. 8C, a plurality of slits ST are formed to penetrate the stacked body LMs and reach the substrate SB. Then, $n^+$-diffusion regions 13 are formed at the respective portions of the substrate SB exposed by the slits ST, by using an ion implantation method or the like.

Figure 9A:
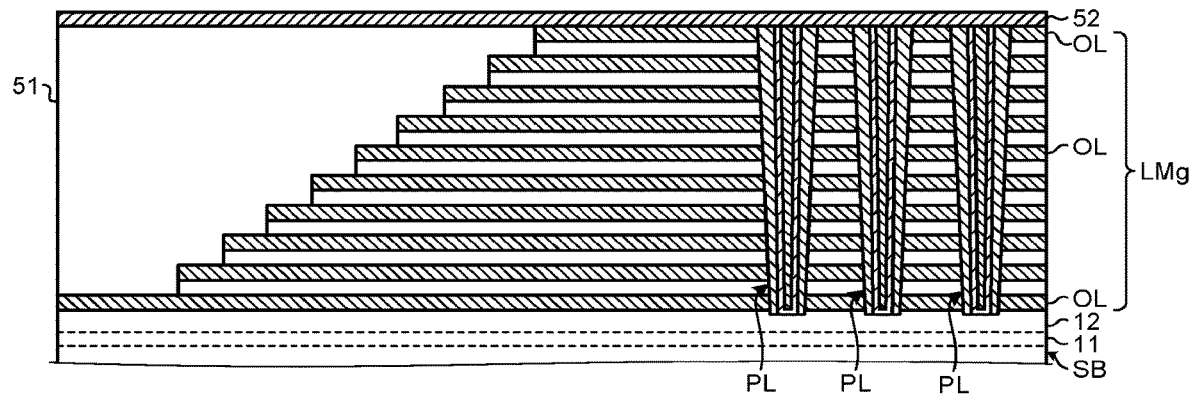
FIGS. 9A to 9C are flow-related diagrams illustrating procedures in the manufacturing method of the semiconductor memory device according to the embodiment 1.
Figure 9B:
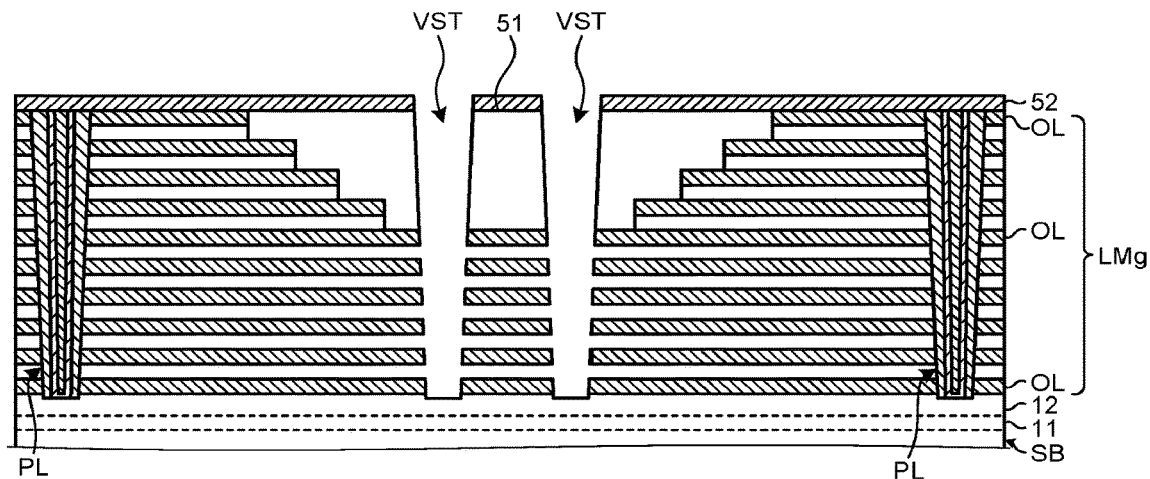
Figure 9C:
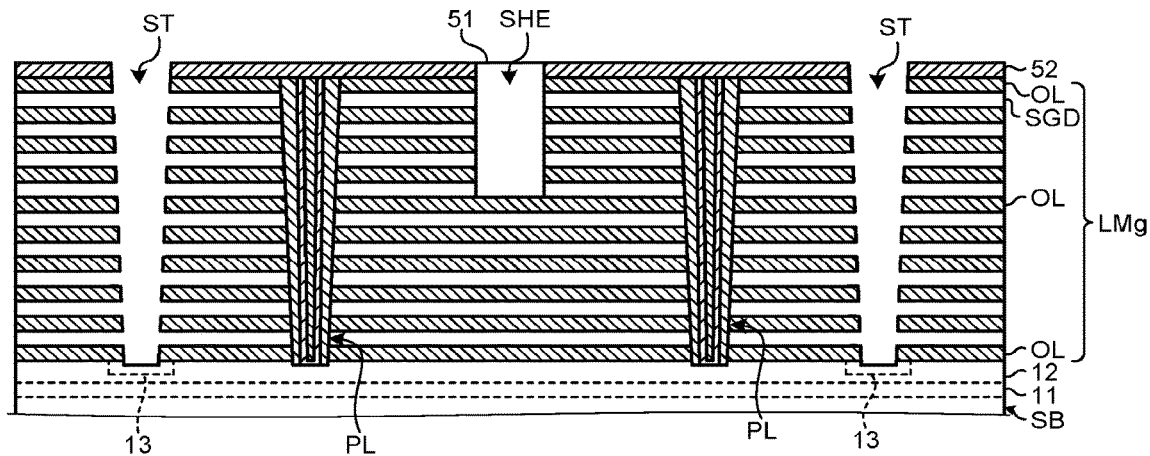

As illustrated in FIGS. 9A to 9C, the sacrificial layers NL of the stacked body LMs are removed mainly through the slits ST. Consequently, a stacked body LMg is formed that includes gaps between the insulating layers OL.

Figure 10A:
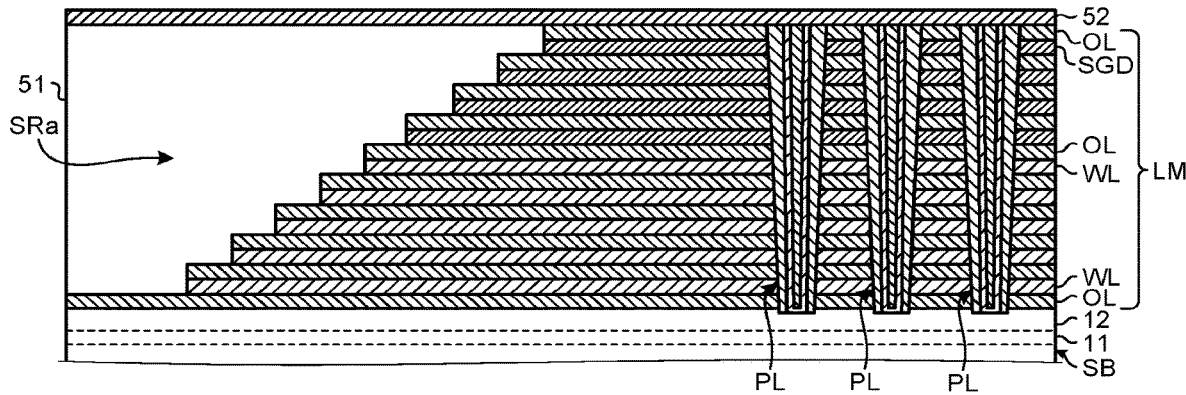
FIGS. 10A to 10C are flow-related diagrams illustrating procedures in the manufacturing method of the semiconductor memory device according to the embodiment 1.
Figure 10B:
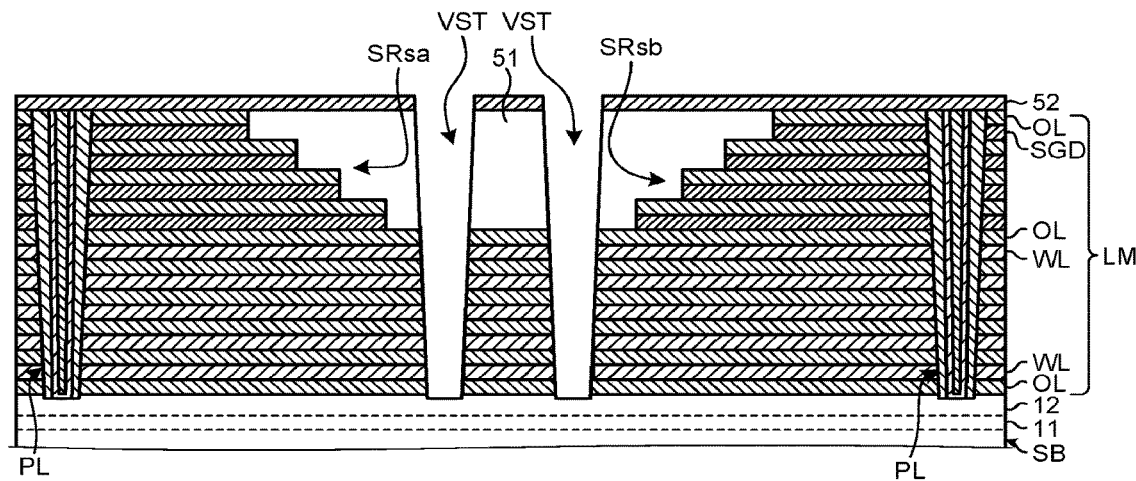
Figure 10C:
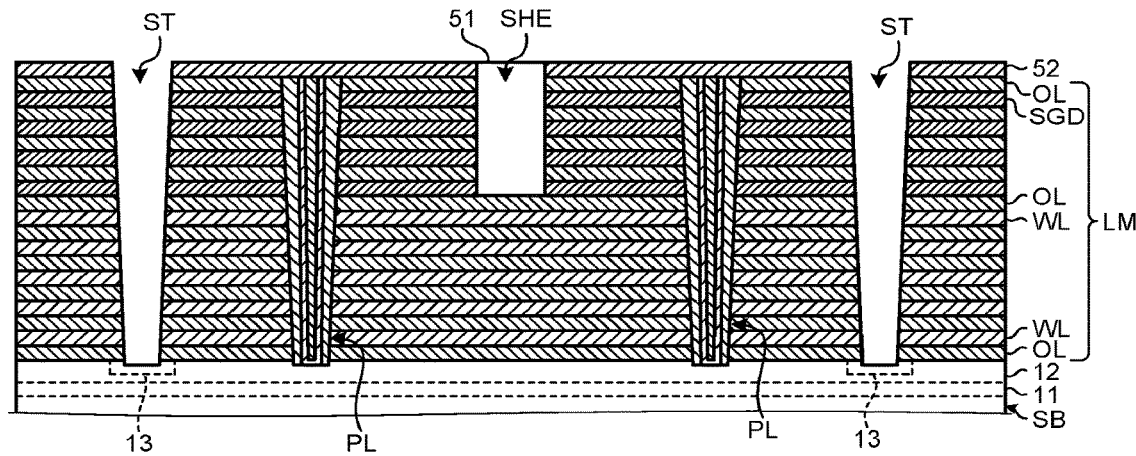

As illustrated in FIGS. 10A to 10C, a conductive material is filled into the gaps of the stacked body LMg mainly through the slits ST to form word lines WL and selection gate lines SGD stacked between the insulating layers OL. Consequently, a stacked body LM is formed in which the word lines WL and the selection gate lines SGD are stacked alternately with the insulating layers OL one by one into a plurality of layers.

Here, the process of replacing the sacrificial layers NL with the word lines WL or the like, as illustrated in FIGS. 9A to 10C, may be referred to as a replacing process.

Figure 11A:
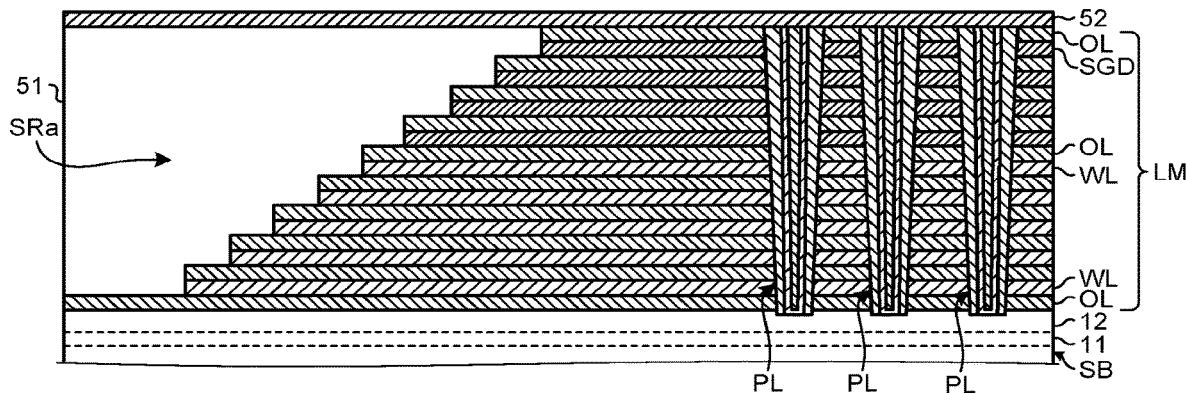
FIGS. 11A to 11C are flow-related diagrams illustrating procedures in the manufacturing method of the semiconductor memory device according to the embodiment 1.
Figure 11B:
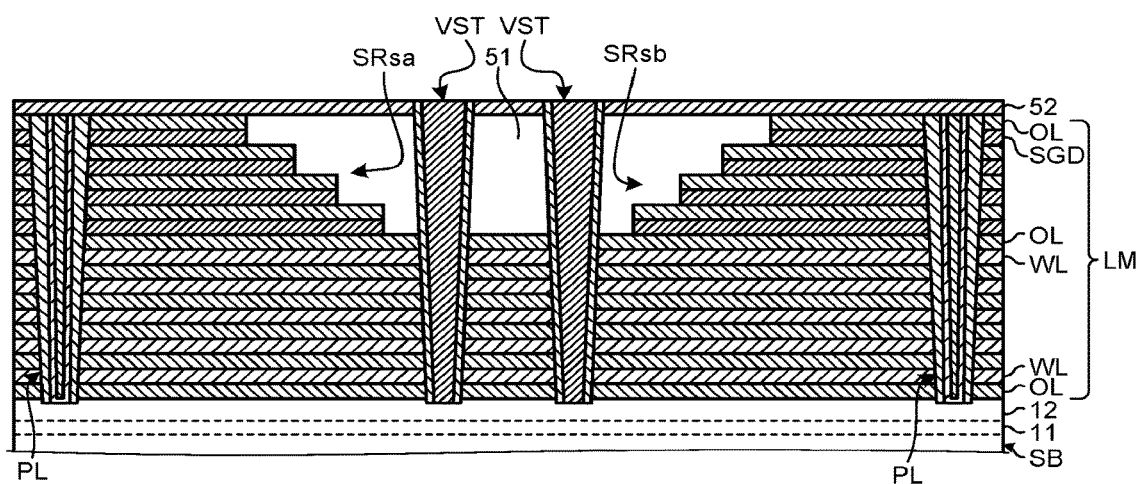
Figure 11C:
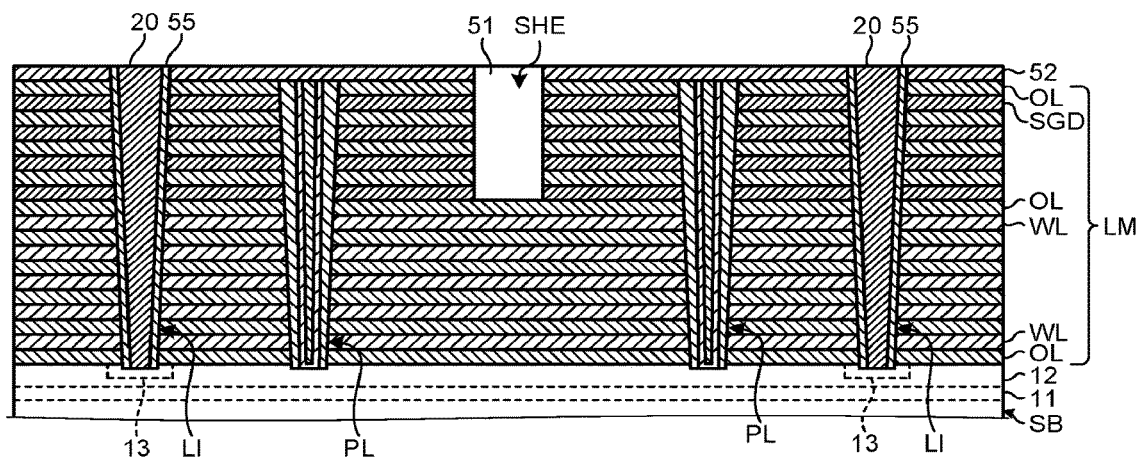

As illustrated in FIGS. 11B and 11C, each of the vertical slits VST and the slits ST is filled with a conductive layer 20 through an insulating layer 55 used as a liner. The portions with the slits ST formed therein become contacts LI.

Figure 12A:
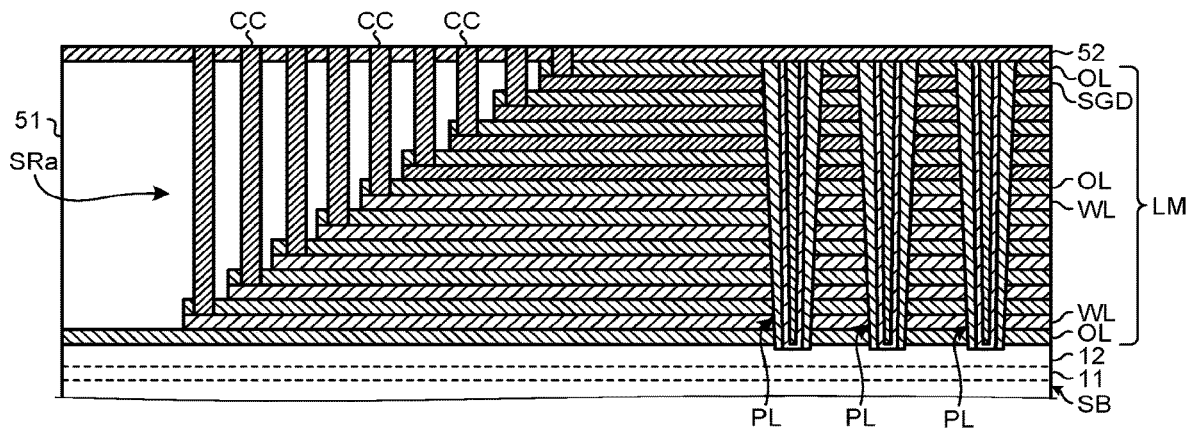
FIGS. 12A to 12C are flow-related diagrams illustrating procedures in the manufacturing method of the semiconductor memory device according to the embodiment 1.

As illustrated in FIG. 12A, contacts CC are formed to penetrate the insulating layers 52 and 51, and the insulating layers OL at the respective steps of the staircase part SRa, and reach the word lines WL and the selection gate lines SGD.

Figure 12B:
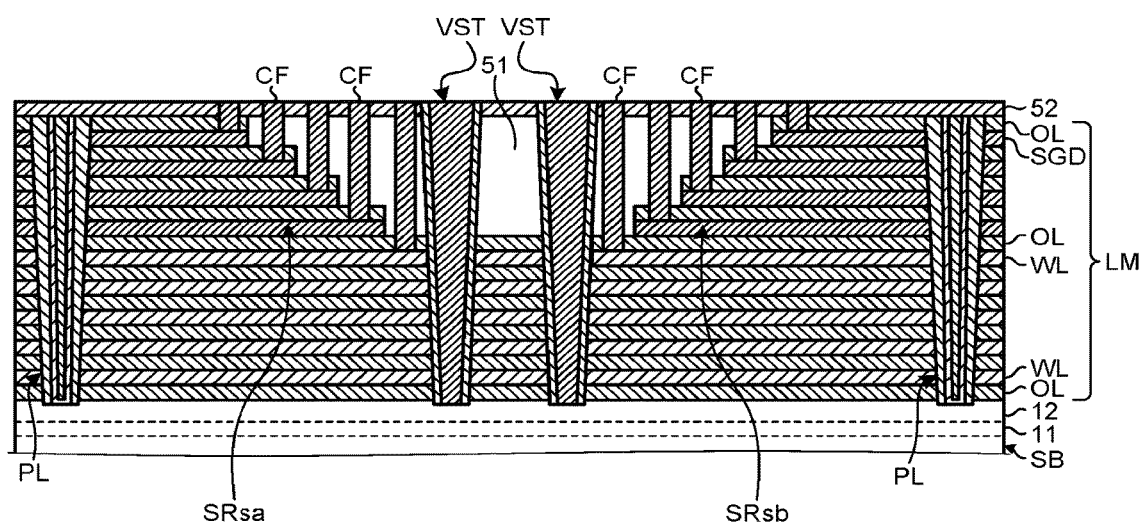
Figure 12C:
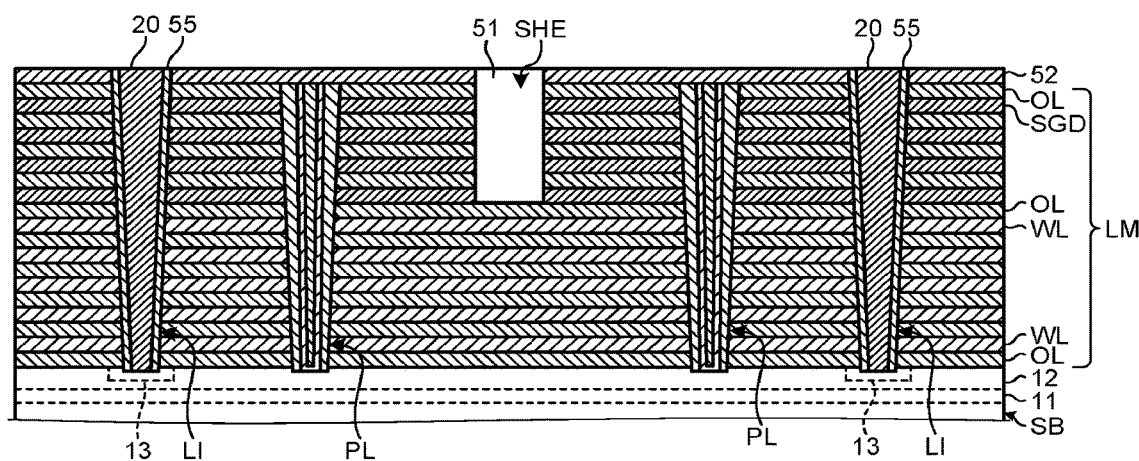

As illustrated in FIG. 12B, contacts CF are formed to penetrate the insulating layers 52, and 51, and one of the insulating layers OL, and reach the uppermost word line WL. Further, at this time, contacts CF may be formed to penetrate the insulating layers 52 and 51, and the insulating layers OL at the respective steps of the staircase parts SRsa and SRsb, and reach the selection gate lines SGD at the respective steps.

Thereafter, an insulating layer 53 is formed on the insulating layer 52. Plugs CH are formed to penetrate the insulating layers 53 and 52 and to be connected to the channels CN of the pillars PL. Plugs V0 are formed to penetrate the insulating layer 53 and to be connected to the contacts CC and CF. Further, upper layer wiring lines associated with the plugs are formed.

As a result, the semiconductor memory device 1 according to the embodiment 1 is manufactured.

Comparative Example

In a three-dimensional nonvolatile memory, word lines are lead out from staircase parts at the opposite ends of a stacked body to exchange electric signals, for example. Where such a stacked body is divided near the center into two sections and these two sections are configured to be individually operated, it is possible to shorten the word line length to improve the signal transmission speed and reduce the RC delay. However, since the configuration of this type includes a staircase part for leading out the word lines only on one side of each stacked body section, it is difficult to monitor how a signal is transmitted to the other side of this section.

The semiconductor memory device 1 according to the embodiment 1 is provided with a contact CF that is connected to the uppermost word line WL of a plurality of word lines WL arranged in contact with each vertical slit VST or connected to the uppermost selection gate line SGD. Consequently, even if the word lines WL arranged in contact with each vertical slit VST form a seep standing array, it is possible to monitor at least a signal transmitted to the uppermost word line WL or uppermost selection gate lines SGD. Specifically, for example, a voltage is applied from the contact CC side to the word line WL or uppermost selection gate line SGD, and an output from the contact CF side is monitored. Consequently, it is possible to observe whether there is a delay in the rise of the voltage in the uppermost word line WL or uppermost select gate line SGD on the vertical slit VST side.

The vertical slit VST side of the word lines WL is most distant from the staircase part SRa or SRb side where signals are input. Further, since each pillar PL arranged in the word lines WL has, for example, an inverted taper shape with a large diameter on the upper side and a small diameter on the lower side, the volume occupied by each pillar PL becomes larger in an upper layer word line WL. In other words, an upper layer word line WL becomes smaller in net volume of the word line WL itself and thereby higher in resistance value. Since the signal monitoring is performed under conditions assumed worst because of the uppermost word line WL at the region most distant from the staircase part SRa or SRb side, as described above, it is possible to obtain data of a situation close to the worst case.

Similarly, a signal transmitted to the selection gate line SGD can be obtained at the vertical slit VST side that is most distant from the staircase part SRa or SRb side where the signal is input. Also in this case, it is possible to obtain data of a situation close to the worst case by monitoring a signal to the uppermost selection gate line SGD.

In the semiconductor memory device 1 according to the embodiment 1, the signal monitoring is performed at a far distant end of a word line WL or selection gate line SGD. For example, such monitoring can be performed at the time of shipping inspection of the semiconductor memory device 1, to help determination as to whether the semiconductor memory device 1 is defective or non-defective. Further, the data obtained by the monitoring can be fed back to the manufacture and development, to improve the quality of the semiconductor memory device 1.

Embodiment 2

Next, a detailed explanation will be given of an embodiment 2 with reference to some of the accompanying drawings. A semiconductor memory device according to the embodiment 2 is different from that according to the embodiment 1 described above in that the staircase parts SRsa and SRsb of the selection gate lines SGD are not included. The other constituent elements are denoted by the same reference symbols as those of the embodiment 1, and their description will be omitted.

Figure 13A:
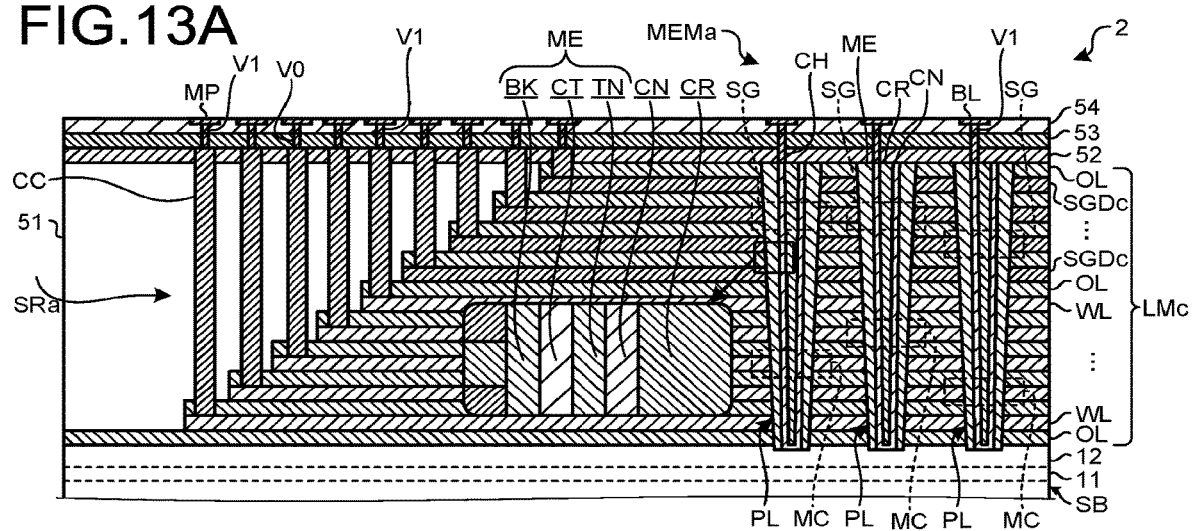
FIGS. 13A to 13C are sectional views of a semiconductor memory device according to an embodiment 2.
Figure 13B:
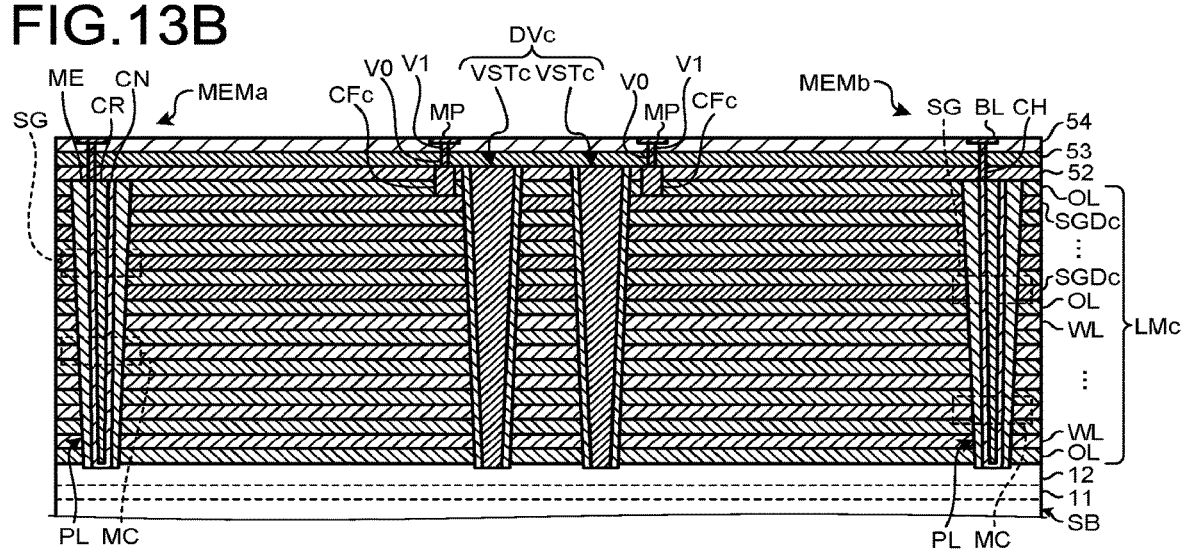
Figure 13C:
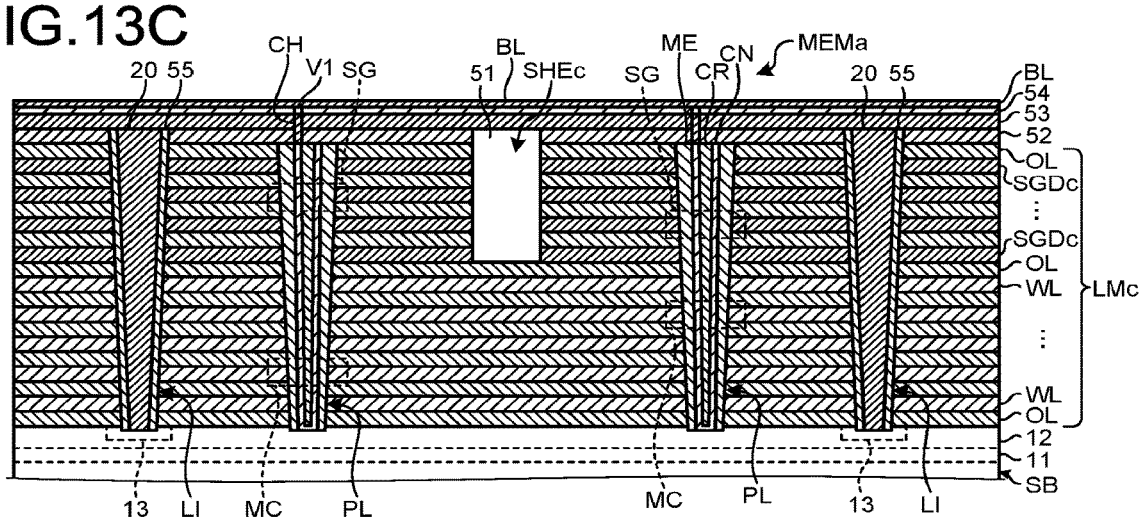

FIGS. 13A to 13C are sectional views of a semiconductor memory device 2 according to the embodiment 2. FIG. 13A is an X-direction sectional view of a memory part MEMa and a staircase part SRa of the semiconductor memory device 2. FIG. 13B is an X-direction sectional view near a dividing part DVc of the semiconductor memory device 2. FIG. 13C is a Y-direction sectional view of the memory part MEMa of the semiconductor memory device 2.

Figure 14:
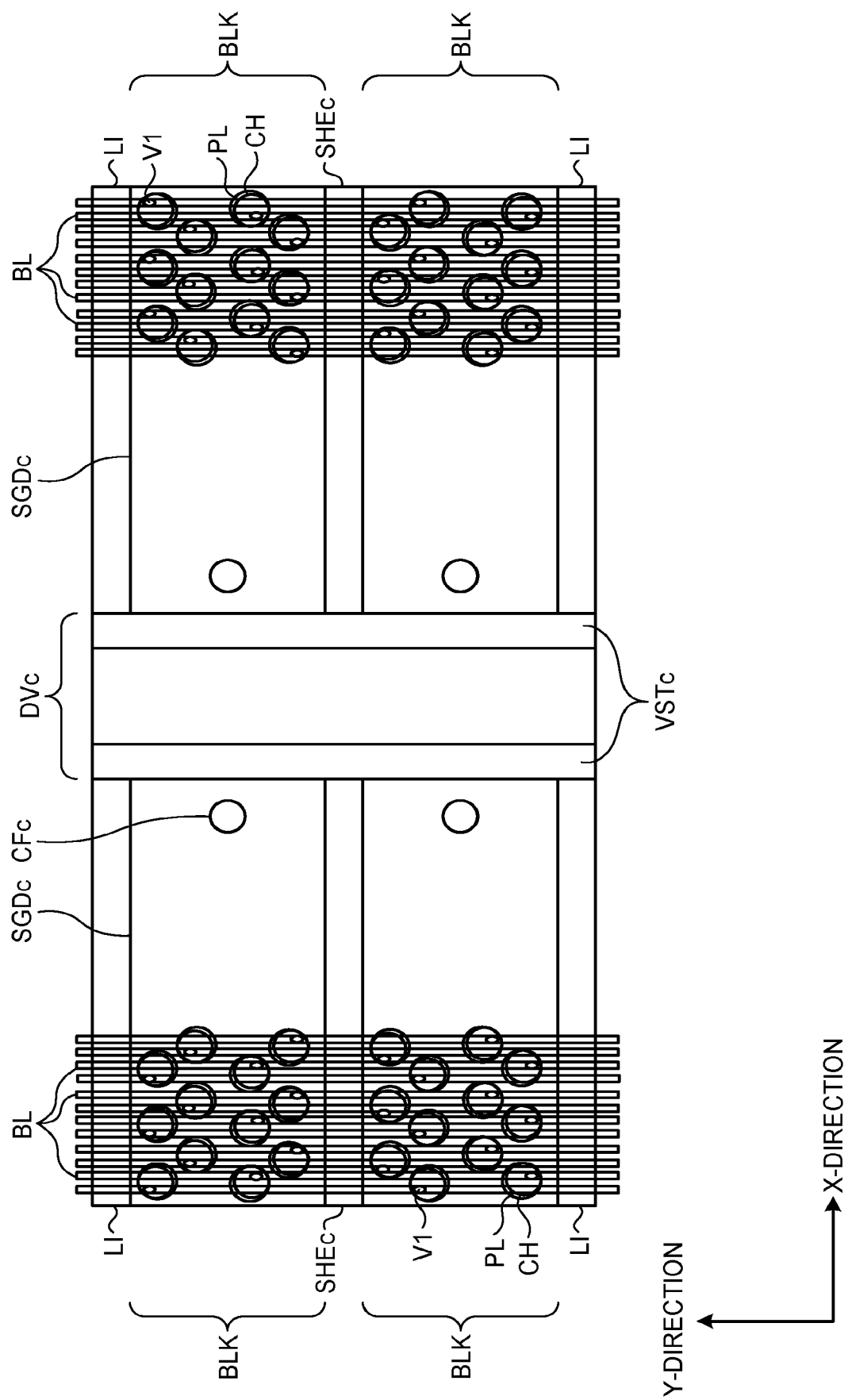
FIG. 14 is a plan view near a dividing part of the semiconductor memory device according to the embodiment 2.

FIG. 14 is a plan view near the dividing part DVc of the semiconductor memory device 2 according to the embodiment 2. Here, in FIG. 14, insulating layers 51 to 53, plugs CH and V0, and so forth are omitted. Further, the number and arrangement of individual components in FIG. 14 are mere examples, and can be changed optionally.

As illustrated in FIGS. 13A to 13C, a stacked body LMc is arranged on the substrate SB. The stacked body LMc has a configuration as an upper structure in which selection gate lines SGDc as conductive layers and insulating layers OL are alternately stacked one by one into a plurality of layers. For example, each of the selection gate lines SGDc includes tungsten, molybdenum, or the like.

The selection gate lines SGDc are selection gate lines on the drain side, the number of which is optional. The stacked body LMc may be configured such that selection gate lines (not illustrated) on the source side are arranged below the lowermost word line WL.

As illustrated in FIGS. 13B and 14, in the dividing part DVc that divides the stacked body LMc, vertical slits VSTc extend in the Y-direction as a plurality of strip parts parallelized in the X-direction. Each vertical slit VSTc penetrates the plurality of selection gate lines SGDc, the plurality of word lines WL, and the plurality of insulating layers OL, and reaches the substrate SB. Consequently, at the end arranged in contact with each vertical slits VSTc, the word lines WL and the selection gate lines SGDc form a substantially vertical standing array.

The uppermost selection gate line SGDc of the selection gate lines SGDc constituting the stacked body LMc is connected to a contact CFc as a second contact. The contact CFc penetrates the insulating layers 52 and the uppermost insulating layer OL of the stacked body LMc, and reaches the uppermost selection gate line SGDc. The upper end of the contact CFc is connected to an upper layer wiring line or the like (not illustrated) through a plug V0 penetrating the insulating layer 53.

The contact CFc outputs, to the upper layer wiring line side, an electric signal, i.e., a voltage, input from a contact CC of the staircase part SRa on one side and transmitted through the selection gate line SGDc.

As illustrated in FIGS. 13C and 14, a shallow groove SHEc is provided between the two contacts LI and extends in the X-direction to split the selection gate lines SGDc within the block BLK in the Y-direction. The shallow groove SHEc penetrates the selection gate lines SGDc of the stacked body LMc and the insulating layers OL paired therewith, and reaches the insulating layer OL immediately above the uppermost word line WL.

The shallow groove SHEc is connected to the vertical slits VSTc at the dividing part DVc. Thus, the selection gate lines SGDc are separated by the shallow groove SHEc without any staircase shape used in the embodiment 1 described above. Consequently, it is possible to set each of the plurality of pillars PL that share the same bit line BL within one block BLK in a selected state or non-selected state, by turning on or off the selection gate SG connected to a selection gate line SGDc.

The semiconductor memory device 2 configured as described above is manufactured in substantially the same way as the semiconductor memory device 1 according to the embodiment 1 described above. However, in the manufacturing method of the semiconductor memory device 2, the staircase parts SRsa and SRsb are not formed.

In the semiconductor memory device 2 according to the embodiment 2, the contact CFc is provided that is connected to the uppermost selection gate line SGDc of the plurality of selection gate lines SGDc arranged in contact with each vertical slit VSTc. Consequently, even if the selection gate lines SGDc arranged in contact with each vertical slit VSTc form a steep standing array, it is possible to obtain at least a signal transmitted to the uppermost selection gate line SGDc.

Since the signal monitoring is performed under conditions assumed worst because of the uppermost selection gate line SGDc at the region most distant from the staircase part SRa side, as described above, it is possible to obtain data of a situation close to the worst case. Consequently, it is also possible to estimate the transmission state of a signal in a lower layer selection gate line SGDc or word line WL.

Other Embodiments

In the embodiments 1 and 2 described above, each of the memory parts MEMa and MEMb and the peripheral circuits PERa and PERb is arrange on the substrate SB. However, embodiments are not limited to this example. For example, a configuration may be adopted in which a peripheral circuit is arranged on a substrate and a memory part is arranged above the peripheral circuit. Alternatively, a configuration may be adopted in which a memory part and a peripheral circuit are arranged on different respective substrates and the memory part and the peripheral circuit are subsequently bonded to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body that includes a plurality of conductive layers stacked via a first insulating layer, and includes, at each of opposite ends in a first direction, a first staircase part in which the plurality of conductive layers are terminated stepwise;
a pillar that extends in the stacked body in a stacking direction of the stacked body, and form memory cells at positions intersecting with at least some conductive layers of the plurality of conductive layers;
a strip part including a conductive material and an insulating material, the conductive material and the insulating material fully dividing the stacked body in the first direction by extending in a second direction crossing the first direction, wherein the conductive material dividing the stacked body has a tapered shape;
a plurality of first contacts that are arranged in the first staircase part, in which each of the first contacts is connected to one of the plurality of conductive layers at each step of the first staircase part;
a second contact that is arranged on a strip part side of the stacked body and is connected to an uppermost conductive layer of the some conductive layers connected to the memory cells and arranged in contact with the strip part; and
a second insulating layer that contacts with the some conductive layers, wherein
the stacked body includes, on the strip part side, a second staircase part in which certain conductive layers of the plurality of conductive layers are terminated stepwise,
the second staircase part gradually ascends from a lowermost conductive layer corresponding to the uppermost conductive layer toward a side opposite to the strip part,
the certain conductive layers in the second staircase part are divided into a first part and a second part,
the strip part is between the first part and the second part,
at least a part of the strip part is in the second insulating layer, and
the second insulating layer contacts with both ends of the first part in the first direction and both ends of the second part in the first direction.

2. The semiconductor memory device according to claim 1, further comprising a third contact that is arranged in the second staircase part, in which the third contact is connected to at least some of the certain conductive layers in the second staircase part.

3. The semiconductor memory device according to claim 1, wherein the second contact is positioned nearer the strip part than the first staircase part is.

4. The semiconductor memory device according to claim 1, further comprising a shallow groove that extends in the first direction and is filled with an insulating material,
wherein the shallow groove divides the certain conductive layers except for a conductive layer corresponding to the lowermost conductive layer in the second staircase part.

5. The semiconductor memory device according to claim 4, wherein the shallow groove extends to an end of the second staircase part positioned on the strip part side, and is arranged out of contact with the strip part.

6. The semiconductor memory device according to claim 5, further comprising a fourth contact that divides the stacked body in the second direction by extending in the first direction,
wherein the fourth contact is arranged on each of opposite sides of the shallow groove in the second direction, and is arranged in contact with the strip part.

7. The semiconductor memory device according to claim 1, further comprising a first circuit and a second circuit, wherein
the stacked body includes a first stacked body section and a second stacked body section separated by the strip part,
the first circuit is configured to operate memory cells arranged in the first stacked body section, of the memory cells, and
the second circuit is configured to operate memory cells arranged in the second stacked body section, of the memory cells.

8. A semiconductor memory device comprising:
a stacked body that includes a plurality of conductive layers stacked via a first insulating layer, and includes, at each of opposite ends in a first direction, a first staircase part in which the plurality of conductive layers are terminated stepwise;
a pillar that extends in the stacked body in a stacking direction of the stacked body, and form memory cells at positions intersecting with at least some conductive layers of the plurality of conductive layers;
a strip part including a conductive material and an insulating material, the conductive material and the insulating material fully dividing the stacked body in the first direction by extending in a second direction crossing the first direction, wherein the conductive material dividing the stacked body has a tapered shape;
a plurality of first contacts that are arranged in the first staircase part, in which each of the first contacts is connected to one of the plurality of conductive layers at each step of the first staircase part;

a second contact that is arranged on a strip part side of the stacked body and is connected to an uppermost conductive layer of the plurality of conductive layers arranged in contact with the strip part; and
a second insulating layer that contacts with the some conductive layers, wherein
the uppermost conductive layer is divided into a first part and a second part,
the strip part is between the first part and the second part,
at least a part of the strip part is in the second insulating layer, and
the second insulating layer contacts with both ends of the first part in the first direction and both ends of the second part in the first direction.

9. The semiconductor memory device according to claim 8, further comprising a shallow groove that extends in the first direction and is filled with an insulating material,
wherein the shallow groove divides some conductive layers positioned as upper layers in the stacked body, which include the uppermost conductive layer, of the plurality of conductive layers included in the stacked body.

10. The semiconductor memory device according to claim 9, wherein the shallow groove is arranged in contact with the strip part.

11. The semiconductor memory device according to claim 10, further comprising a fourth contact that divides the stacked body in the second direction by extending in the first direction,
wherein the fourth contact is arranged on each of opposite sides of the shallow groove in the second direction, and is arranged in contact with the strip part.

12. The semiconductor memory device according to claim 10, wherein the second contact is connected to one of four parts of the uppermost conductive layer divided by the strip part and the shallow groove.

13. The semiconductor memory device according to claim 12, wherein the second contact includes a plurality of second contacts connected to the respective four parts of the uppermost conductive layer thus divided.

14. The semiconductor memory device according to claim 8, further comprising a first circuit and a second circuit, wherein
the stacked body includes a first stacked body section and a second stacked body section separated by the strip part,
the first circuit is configured to operate memory cells arranged in the first stacked body section, of the memory cells, and
the second circuit is configured to operate memory cells arranged in the second stacked body section, of the memory cells.

15. A semiconductor memory device comprising:
a stacked body that includes a plurality of conductive layers stacked via a first insulating layer, and includes, at each of opposite ends in a first direction, a first staircase part in which the plurality of conductive layers are terminated stepwise;
a pillar that extends in the stacked body in a stacking direction of the stacked body, and form memory cells at positions intersecting with at least some conductive layers of the plurality of conductive layers;
a strip part that divides the stacked body in the first direction by extending in a second direction crossing the first direction;
a plurality of first contacts that are arranged in the first staircase part, in which each of the first contacts is connected to one of the plurality of conductive layers at each step of the first staircase part;
a second contact that is arranged on a strip part side of the stacked body and is connected to an uppermost conductive layer of the some conductive layers connected to the memory cells and arranged in contact with the strip part;
a second insulating layer that contacts with the some conductive layers;
a shallow groove that extends in the first direction and is filled with an insulating material; and
a fourth contact that divides the stacked body in the second direction by extending in the first direction, wherein
the stacked body includes, on the strip part side, a second staircase part in which certain conductive layers of the plurality of conductive layers are terminated stepwise,
the second staircase part gradually ascends from a lowermost conductive layer corresponding to the uppermost conductive layer toward a side opposite to the strip part,
the certain conductive layers in the second staircase part are divided into a first part and a second part,
the strip part is between the first part and the second part,
at least a part of the strip part is in the second insulating layer,
the second insulating layer contacts with both ends of the first part in the first direction and both ends of the second part in the first direction,
the shallow groove divides the certain conductive layers except for a conductive layer corresponding to the lowermost conductive layer in the second staircase part, and
the fourth contact is arranged on each of opposite sides of the shallow groove in the second direction, and is arranged in contact with the strip part.

16. A semiconductor memory device comprising:
a stacked body that includes a plurality of conductive layers stacked via a first insulating layer, and includes, at each of opposite ends in a first direction, a first staircase part in which the plurality of conductive layers are terminated stepwise;
a pillar that extends in the stacked body in a stacking direction of the stacked body, and form memory cells at positions intersecting with at least some conductive layers of the plurality of conductive layers;
a strip part that divides the stacked body in the first direction by extending in a second direction crossing the first direction;
a plurality of first contacts that are arranged in the first staircase part, in which each of the first contacts is connected to one of the plurality of conductive layers at each step of the first staircase part;
a second contact that is arranged on a strip part side of the stacked body and is connected to an uppermost conductive layer of the plurality of conductive layers arranged in contact with the strip part;
a second insulating layer that contacts with the some conductive layers;
a shallow groove that extends in the first direction and is filled with an insulating material; and a fourth contact that divides the stacked body in the second direction by extending in the first direction, wherein the uppermost conductive layer is divided into a first part and a second part, the strip part is between the first part and the second part, at least a part of the strip part is in the second insulating layer, the second insulating layer contacts with both ends of the first part in the first direction and both ends of the second part in the first direction, the shallow groove divides some conductive layers positioned as upper layers in the stacked body, which include the uppermost conductive layer, of the plurality of conductive layers included in the stacked body, and the fourth contact is arranged on each of opposite sides of the shallow groove in the second direction, and is arranged in contact with the strip part.

* * * * *